(12) United States Patent
McBride et al.

(10) Patent No.: US 12,146,996 B2
(45) Date of Patent: Nov. 19, 2024

(54) QUANTUM ELECTROMAGNETIC FIELD SENSOR AND IMAGER

(71) Applicant: SRI International, Menlo Park, CA (US)

(72) Inventors: Sterling Eduardo McBride, Princeton, NJ (US); Jesse Wodin, Denver, CO (US); Cale M. Gentry, Erie, CO (US); Kaitlin Moore, Skillman, NJ (US)

(73) Assignee: SRI INTERNATIONAL, Menlo Park, CA (US)

( * ) Notice: Subject to any disclaimer, the term of this patent is extended or adjusted under 35 U.S.C. 154(b) by 32 days.

(21) Appl. No.: 17/906,386

(22) PCT Filed: Dec. 17, 2020

(86) PCT No.: PCT/US2020/065738
§ 371 (c)(1),
(2) Date: Sep. 15, 2022

(87) PCT Pub. No.: WO2021/188177
PCT Pub. Date: Sep. 23, 2021

(65) Prior Publication Data
US 2023/0137266 A1 May 4, 2023

Related U.S. Application Data

(60) Provisional application No. 62/991,999, filed on Mar. 19, 2020.

(51) Int. Cl.
*G01T 1/185* (2006.01)
(52) U.S. Cl.
CPC .................................. *G01T 1/185* (2013.01)

(58) Field of Classification Search
CPC ....................................................... G01T 1/185
See application file for complete search history.

(56) References Cited

U.S. PATENT DOCUMENTS 7,400,207 B2   7/2008  Lipp et al.
7,470,971 B2   12/2008  McBride
(Continued)

FOREIGN PATENT DOCUMENTS

CN    110361604 A    10/2019
WO    2019014330 A1    1/2019

OTHER PUBLICATIONS

Response to Communication Pursuant to Rules 161(1) and 162 EPC dated Oct. 26, 2022, from counterpart European Application No. 20925854.0, filed Apr. 25, 2023, 11 pp.
(Continued)

*Primary Examiner* — David P Porta
*Assistant Examiner* — Fani Polyzos Boosalis
(74) *Attorney, Agent, or Firm* — Shumaker & Sieffert, P.A.

(57) ABSTRACT

A sensor comprising a vapor cell including a vapor of alkali atoms is disclosed. The sensor further comprises a first photonic integrated circuit (PIC) configured to direct light of a first wavelength into the vapor cell and incident on the vapor of alkali atoms, wherein the light of the first wavelength is configured to excite the alkali atoms to a first excited state from a ground state. The sensor further comprises a detector configured to detect a response of the alkali atoms, after the alkali atoms are excited from the first excited state to a Rydberg state, to incident electromagnetic radiation.

20 Claims, 12 Drawing Sheets

(56) References Cited

U.S. PATENT DOCUMENTS

| | | | |
|---|---|---|---|
| 7,807,509 B2 | 10/2010 | McBride | |
| 7,955,551 B2 | 6/2011 | McBride et al. | |
| 8,080,778 B2 | 12/2011 | McBride | |
| 8,299,860 B2* | 10/2012 | Youngner | G04F 5/14 |
| | | | 438/456 |
| 8,405,021 B2 | 3/2013 | Anderson et al. | |
| 8,415,612 B2 | 4/2013 | McBride et al. | |
| 10,774,220 B1* | 9/2020 | Roper | G04F 5/14 |
| 2004/0227088 A1 | 11/2004 | Trotz et al. | |
| 2009/0289629 A1 | 11/2009 | Tuchman | |
| 2015/0048824 A1 | 2/2015 | Bohi et al. | |
| 2016/0363617 A1 | 12/2016 | Anderson et al. | |
| 2019/0187198 A1 | 6/2019 | Anderson et al. | |
| 2019/0310422 A1 | 10/2019 | Seyedi et al. | |
| 2021/0048465 A1 | 2/2021 | Anderson et al. | |

OTHER PUBLICATIONS

"InGaAs PIN photodiodes", Hamamatsu, Retrieved from: https://www.hamamatsu.com/resources/pdf/ssd/g10899_series_kird1109e.pdf, Dec. 2017, 5 pp.

"New-Generation Terahertz Imagers", Terasense, Retrieved from: www.terasense.com, Accessed on: Jan. 29, 2020, 5 pp.

Anderson et al., "High-Resolution Antenna Near-Field Imaging and Sub-THz Measurements with a Small Atomic Vapor-Cell Sensing Element", 2018 11th Global Symposium on Millimeter Waves (GSMM), May 22, 2018, 3 pp.

Dhillon et al., "The 2017 terahertz science and technology roadmap", vol. 50, Journal of Physics D: Applied Physics, Jan. 4, 2017, 49 pp.

Downes et al., "Ultra-high-speed Terahertz Imaging using Atomic Vapour", arXiv:1903.01308v1, Mar. 15, 2019, 9 pp.

Fan et al., "Atom based RF electric field sensing", vol. 48, No. 20, Journal of Physics B: Atomic, Molecular and Optical Physics, Sep. 9, 2015, 16 pp.

Fan et al., "Sub-wavelength microwave electric field imaging using Rydberg atoms inside atomic vapor cells", Optic Letters, vol. 39, No. 10, Mar. 14, 2014, pp. 1-5.

Fesharaki et al., "Accurate theoretical and experimental characterization of optical grating coupler", vol. 24, No. 18, Nov. 5, 2016, 11 pp.

Hill, "Quantum Defect Measurements for High Angular Momentum Rydberg States of Potassium", Colby, Colby College, May 2020, 28 pp., Retrieved from the Internet on Aug. 31, 2022 from URL: https://digitalcommons.colby.edu/cgi/viewcontent.cgi?article=2003&context=honorstheses.

Holloway et al., "Broadband Rydberg Atom-Based Electric-Field Probe for SI-Traceable, Self-Calibrated Measurements", IEEE Transactions on Antennas and Propagation, vol. 62, No. 12, Dec. 2014, pp. 6169-6182.

Holloway et al., "Sub-Wavelength Imaging and Field Mapping via EIT and Autler-Townes Splitting in Rydberg Atoms", vol. 104, No. 24, Applied Physics Letters, arXiv:1404.0289v1, Apr. 1, 2014, 12 pp.

International Preliminary Report on Patentability from International Application No. PCT/US2020/065738 dated Sep. 29, 2022, 9 pp.

International Search Report and Written Opinion of International Application No. PCT/US2020/065738 dated Mar. 8, 2021, 11 pp.

Iwaszczuk et al., "Terahertz radar cross section measurements", Optics Express, vol. 18, No. 25, Dec. 6, 2010, pp. 26399-26408.

Kline, "Flight Qualification of a Terahertz Imaging Camera as a CubeSat Payload", Thesis Naval Postgraduate School, Jun. 1, 2018, 125 pp.

Lui et al., "Video-rate Terahertz Interferometric and Synthetic Aperture Imaging", vol. 48, No. 19, Jun. 24, 2009, pp. 3788-3795.

Moore et al., "Measurement of Rb g-series quantum defect using two-photon microwave spectroscopy", arXiv:2004.11407v3, Jul. 29, 2020, 9 pp.

Smith, "Theory and Design of Smith-Purcell Semiconductor Terahertz Sources", IEEE, Dec. 2013, 141 pp.

Thaicharoen et al., "Electromagnetically-induced transparency, absorption, and microwave field sensing in a Rb vapor cell with a three-color all-infrared laser system", arXiv:1905.09925v1, May 23, 2019, 9 pp.

U.S. Appl. No. 01/190,057, naming inventors McBride et al.

Van Dijk et al., "Integrated InP Heterodyne Millimeter Wave Transmitter", vol. 26, No. 10, IEEE, Mar. 3, 2014, pp. 965-968.

Webelements, "Rubidium: properties of free atoms", Retrieved from: https://www.webelements.com/rubidium/atoms.html#:~:text=Rubidium%20atoms%20have%2037%20electrons,neutral%20rubidium%20is%20%5BKr%5D, Accessed on Dec. 21, 2020, 7 pp.

Williams, "Filling the THz gap-high power sources and applications", vol. 69, No. 2, Reports on Progress in Physics, Dec. 5, 2005, p. 301-326.

U.S. Appl. No. 18/577,054, filed Jul. 6, 2022, naming inventors Moore et al.

Extended Search Report from counterpart European Application No. 20925854.0 dated Mar. 4, 2024, 18 pp.

Hummon et al., "Photonic chip for laser stabilization to an atomic vapor X X with 10-11 instability", OPTICA, vol. 5, No. 4, Apr. 11, 2018, pp. 443-449.

Simons et al., "Fiber-coupled vapor cell for a portable Rydberg atom-based radio frequency electric field sensor", Applied Optics, vol. 57, No. 22, Aug. 1, 2018, pp. 6456-6460.

Wade et al., "Real-Time Near-Field Terahertz Imaging with Atomic Optical Fluorescence", arXiv:1603.07107v2, Mar. 23, 2016, pp. 1-5.

Response to Communication pursuant to Article 70(2) EPC dated Mar. 21, 2023 , from counterpart European Application No. 20925854.0, filed Sep. 20, 2024, pp. 15.

* cited by examiner

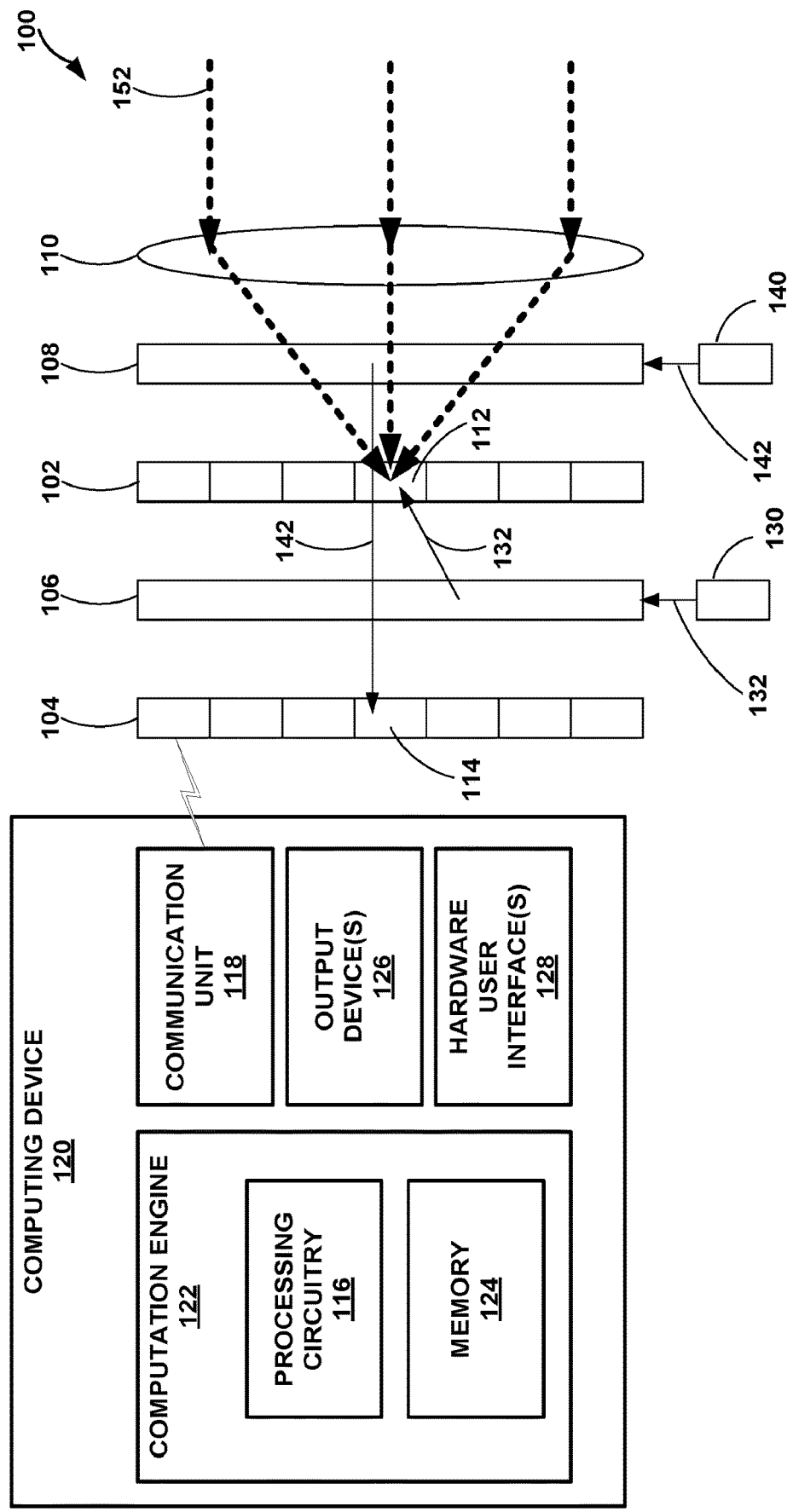
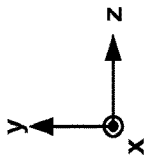
FIG. 1

QUANTUM ELECTROMAGNETIC FIELD SENSOR AND IMAGER

This application is a National Stage Entry of International Application No. PCT/US2020/065738, filed Dec. 17, 2020, which claims the benefit of U.S. Provisional Patent Application No. 62/991,999, filed Mar. 19, 2020, each of which is incorporated herein by reference in its entirety.

TECHNICAL FIELD

This disclosure generally relates to imaging devices.

BACKGROUND

An image sensor may be a semiconductor device for converting electromagnetic radiation into electric signals. Examples include charge coupled devices (CCDs), complementary metal-on-semiconductor (CMOS) devices, photo-diode arrays, charge injection devices, hybrid focal plane arrays, etc. For electromagnetic radiation in the terahertz (THz) frequency range, e.g., millimeter-waves, conventional imagers may include micro-bolometers, photo-conductive devices, folded-dipole antennas, Schottky-barrier diodes, pyrometric devices, and Golay cells, e.g., opto-acoustic detectors.

SUMMARY

In general, the disclosure describes a sensor array for imaging electromagnetic (EM) radiation having frequencies in the megahertz (MHz), gigahertz (GHz), and terahertz (THz) ranges (MHz/GHz/THz EM radiation). In some examples, a vapor cell array may operate as a transducer to convert electromagnetic radiation having frequencies in a first range to electromagnetic radiation having frequencies in a second range. In some examples, compared to direct detection of electromagnetic radiation in the first range, electromagnetic radiation in the second frequency range may be more discernable, have a higher signal-to-noise (SNR) ratio, may be less expensive to detect, detectable with a smaller or light apparatus, and have a higher sensitivity.

In some examples, a vapor cell array may include a plurality of vapor cells including alkali atoms. The alkali atoms may be prepared in a Rydberg state in which the alkali atoms are excited such that one or more electrons have a very high principal quantum number, n. The alkali atoms in a Rydberg state may have loosely bound valence electrons that may be perturbed or ionized by collisions or external fields, e.g., MHz/GHz/THz radiation. In some examples, the alkali atoms of each vapor cell of a vapor cell array may be prepared by excitation via coupling light having a first frequency and probe light having a second frequency. In some examples, the frequency of one or both of the coupling light and the probe light may be ultraviolet, visible, or near infrared (UV/VIS/NIR) frequencies. The probe light may excite the alkali atoms from a first quantum energy level to a second quantum energy level, and the coupling light may excite the alkali atoms from the second quantum energy level to a third quantum energy level such that the alkali atoms are in a Rydberg state.

In some examples, the alkali atoms in the Rydberg state may exhibit electromagnetically induced transparency (EIT) for frequencies near the frequency of the probe light. The probe light may be configured to be detected by a detector array after transmission through a vapor cell of the vapor cell array. Perturbations of the alkali atoms in the Rydberg state via EM radiation in the MHz/GHz/THz frequency ranges may be detected via changes of an EIT spectral window of the probe light transmitting through the vapor cell array to the detector array, resulting in a signal of the probe light in the UV/VIS/NIR frequency ranges that may be proportional to the magnitude and frequency of the EM radiation in the MHz/GHz/THz frequency ranges.

In some examples, an imaging system includes an array of vapor cells and an array of detectors. Probe light and coupling light in the UV/VIS/NIR frequency range may be used to image incident electromagnetic radiation in the MHz/GHz/THz frequency range.

Accordingly, the techniques may provide one or more technical advantages that realize at least one practical application. For example, the techniques may improve the sensitivity and signal to noise ratio (SNR) of a MHz/GHz/THz electromagnetic radiation imaging system. The techniques may reduce the size, weight, and required power (SWaP), and cost of a MHz/GHz/THz electromagnetic radiation imaging system.

In some examples, this disclosure describes a sensor comprising a vapor cell including a vapor of alkali atoms, a first photonic integrated circuit (PIC) configured to direct light of a first wavelength into the vapor cell and incident on the vapor of alkali atoms, wherein the light of the first wavelength is configured to excite the alkali atoms to a first excited state from a ground state, and a detector configured to detect a response of the alkali atoms, after the alkali atoms are excited from the first excited state to a Rydberg state, to incident electromagnetic radiation.

In some examples, this disclosure describes a method comprising exciting alkali atoms in a vapor cell, via light of a first wavelength from a first photonic integrated circuit (PIC), to a second quantum state from a first quantum state, exciting the alkali atoms in the plurality vapor cells, via light of a second wavelength, to a Rydberg state, detecting a response of the alkali atoms in the Rydberg state to incident electromagnetic radiation, and outputting a signal proportional to the detected response.

In some examples, this disclosure describes an electromagnetic radiation detection array comprising a plurality of vapor cells arranged in a two-dimensional (2D) array, each vapor cell including a vapor of alkali atoms, a first photonic integrated circuit (PIC) configured to direct light of a first wavelength into each vapor cell of the plurality of vapor cells and incident on the vapor of alkali atoms, wherein the light of the first wavelength is configured to excite the alkali atoms to a first excited state from a ground state, a second PIC configured to direct light of a second wavelength into each vapor cell of the plurality of vapor cells and incident on the vapor of alkali atoms, wherein the light of the second wavelength is configured to excite the alkali atoms from the first excited state to a Rydberg state, and a plurality of detectors, each detector corresponding to one of the plurality of vapor cells and configured to detect a response of the alkali atoms in the Rydberg state to incident electromagnetic radiation.

The details of one or more examples of the techniques of this disclosure are set forth in the accompanying drawings and the description below. Other features, objects, and advantages of the techniques will be apparent from the description and drawings, and from the claims.

BRIEF DESCRIPTION OF DRAWINGS

FIG. 1 is a cross-sectional block diagram illustrating an example imaging system, in accordance with the techniques of the disclosure.

Like reference characters refer to like elements throughout the figures and description.

DETAILED DESCRIPTION

Figure 2:
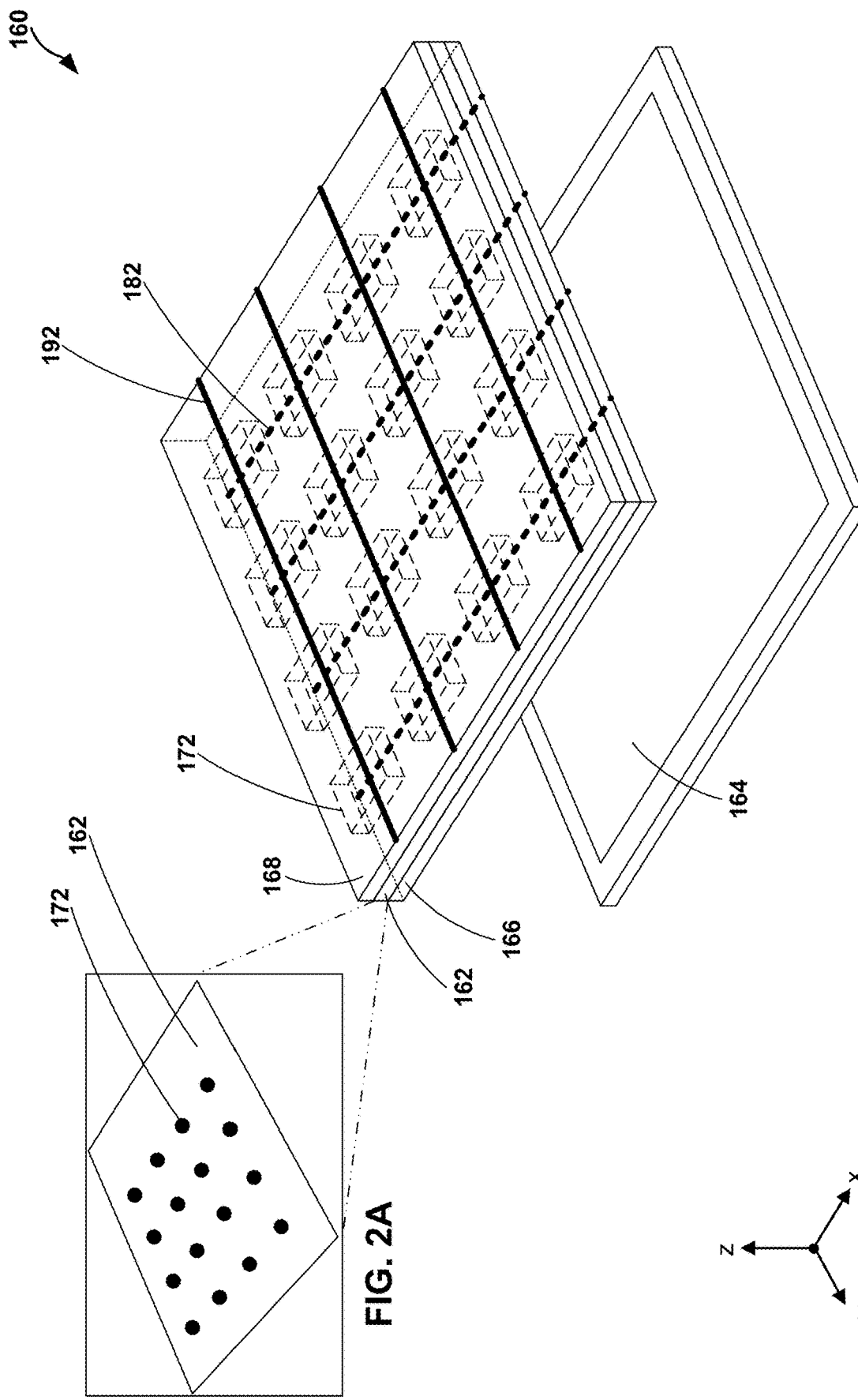
FIG. 2A is a perspective view of an example vapor cell array, in accordance with the techniques of the disclosure.
FIG. 2B is a perspective view of a partially transparent block diagram illustrating an example imaging system 160, in accordance with the techniques of the disclosure.

Terahertz (THz) radiation may be used in a range of different applications such as telecommunications and wireless networks (use of millimeter-wave mobile broadband systems), antennas and advanced radar applications, environmental monitoring, counterterrorism, astronomic observation such as in small satellites and cubesats, characterizing materials, characterizing electromagnetic interference, medical testing, microwave background detection, and so forth. Some advantages of terahertz radiation are its low energy profile and non-ionizing profile, making it relatively harmless.

There are many possible applications using THz detectors and imagers. For example, THz detectors can be integrated into self-calibrated electric field and power sensors in the radio frequency (RF), microwave and millimeter-wavelength regimes, e.g., high energy applications with greater than 1 kilovolt/meter (kV/m) electric fields. In the area of security, THz imaging can be used to detect concealed cargo or weapons. Millimeter-wave imagers can be used for aeronautical applications; for example, to monitor ground movement of aircrafts in adverse weather conditions. In addition, millimeter-wave sensors can be applied in biological sensing to monitor vital signs at a large stand-off distance.

FIG. 1 is a cross-sectional block diagram illustrating an example imaging system 100, in accordance with the techniques of the disclosure. In the example shown, imaging system 100 includes vapor cell array 102, detector array 104, first waveguide 106, second waveguide 108, imaging optics 110, and computing device 120. Imaging system 100 may also include coupling light source 130 and probe light source 140. FIG. 1 also illustrates processing circuitry 116 communicatively coupled to imaging system 100 and memory 124 communicatively coupled to processing circuitry 116. While the cross-sectional view of imaging system 100 in FIG. 1 illustrates imaging system 100 in one-dimension (1D), imaging system 100 may be a two-dimensional (2D) system, e.g., vapor cell array 102, detector array 104, first waveguide 106, and second waveguide 108 may be two-dimensional arrays including a plurality of individual elements, such as detectors 114 and vapor cells 112, in both the x-direction and y-direction.

Vapor cell array 102 may include a plurality of vapor cells 112, each vapor cell 112 including a vapor of atoms, for example, alkali atoms. As noted above, although the cross-sectional view of FIG. 1 illustrates vapor cell array 102 as a 1D array including a plurality of vapor cells 112 in the y-direction, vapor cell array 102 may be a 2D array including a plurality of vapor cells 112 in both the x-direction and the y-direction. In some examples, each vapor cell 112 is configured to be a transducer to convert electromagnetic radiation having frequencies in a first range to electromagnetic radiation having frequencies in a second range. For example, each vapor cell 112 may transduce, or convert, electromagnetic radiation 152 having frequencies in the megahertz (MHz), gigahertz (GHz), and terahertz (THz) ranges (MHz/GHz/THz radiation 152) to optical frequencies in petahertz (PHz) ranges. Stated in terms of wavelengths, each vapor cell 112 may convert electromagnetic radiation in the meter- to millimeter-wavelength ranges to electromagnetic radiation in the UV/VIS/NIR wavelength ranges.

In some examples, each vapor cell 112 may include a vapor of atoms configured to be exhibit electromagnetic induced transparency (EIT). For example, the alkali atoms of each vapor cell 112 may be prepared in a Rydberg state by driving the alkali atoms from a first quantum energy level to a higher second quantum energy level via probe light 142, and further driving the alkali atoms from the second quantum energy level to a third higher quantum energy level via coupling light 132, as further illustrated and described below with respect to FIG. 6. In the presence of a strong on-resonant coupling light 132, e.g., coupling light 132 having a frequency closely matched to the energy gap between the second and third quantum states, the index of refraction of the vapor of alkali atoms of vapor cell 112 may be modified for frequencies near the frequency of probe light 142 resulting in an EIT window in the absorption spectrum of the alkali atoms near that frequency, e.g., the frequency of probe light 142. As such, the absorption spectrum of the alkali atoms as a function of probe light 142 frequency detuning may be observed, as further illustrated and described below with respect to FIG. 7.

The EIT transparency window may have a spectral width less than 1 MHz, less than 10 MHz, or less than 100 MHz, and may allow for sub-Doppler precision in measurement of the response of the alkali atoms to MHz/GHz/THz electromagnetic radiation at room temperature. For example, perturbations of the energy level of the alkali atoms in the third quantum energy level, e.g., a Rydberg state, may be measured via changes in the EIT window detected via intensity of probe light 142 at detector array 104. In other words, each alkali atom may act as an independent transducer converting incident MHz/GHz/THz electromagnetic radiation to an optical signal, and the ensemble of alkali atoms of vapor cell 112 may incoherently amplify the optical signal.

In some examples, probe light 142 may be UV/VIS/NIR light. For example, probe light 142 may be 780 nm laser light, and probe light source 140 may be a 780 nm laser. In some examples, coupling light 132 may be UV/VIS/NIR light. For example, coupling light 132 may be 480 nm laser light, and coupling light source 130 may be a 480 nm laser.

First waveguide 106 may be configured to transport and extract coupling light 132 to one or more vapor cells 112. In some examples, first waveguide 106 may be a photonic integrated circuit (PIC) including a waveguide and one or more extraction features. As noted above, although the cross-sectional view of FIG. 1 illustrates first waveguide 106 as a 1D structure having a height in the y-direction and a thickness in the z-direction, first waveguide 106 may be a 2D structure having a height in the y-direction, a width in the x-direction, and a thickness in the z-direction, and may include a plurality of structural features disposed in both the x-direction and the y-direction, e.g., corresponding to the vapor cells 112 of a 2D vapor cell array 102. In some examples, first waveguide 106 may be configured to transport coupling light 132 via total internal reflection (TIR) to distribute coupling light 132 over a 2D area and extract coupling light 132 via extraction features on either a front surface or a back surface, e.g., surfaces within the x-y plane, or within first waveguide 106. In some examples, the extraction features may be configured to frustrate TIR and direct coupling light 132 in a predetermined direction from a predetermined position of first waveguide 106, e.g., towards one or more vapor cells 112. In some examples, coupling light source 130 may inject coupling light 132 into one or more edges of first waveguide 106, as illustrated in FIG. 1. In other examples, first waveguide 106 may be an optical element having optical power such as a lens or lenslet array, a diffraction grating, or any optical element configured to direct coupling light 132 to vapor cells 112 of vapor cell array 102. In some examples, first waveguide 106 may not be waveguide transporting coupling light 132 via TIR but may be any other structure configured to direct coupling light 132 in a predetermined direction from a predetermined position of first waveguide 106, e.g., an array of beam splitters. In some examples, system 100 may include a plurality of coupling light sources 130, for example, distributed along one or more edges of first waveguide 106 and configured to inject coupling light into one or more edges of first waveguide 106. In some examples, coupling light source 130 may inject coupling light into first waveguide 106 via any surface and at any position of first waveguide 106, e.g., via emitting light to a coupling structure located on any surface of first waveguide 106 and configured to direct coupling light into first waveguide 106 for transport.

Second waveguide 108 may be configured to transport and extract probe light 142 to detector array 104 through vapor cell array 102. In some examples, second waveguide 108 may be a PIC including a waveguide having one or more extraction features. As noted above, although the cross-sectional view of FIG. 1 illustrates second waveguide 108 as a 1D structure having a height in the y-direction and a thickness in the z-direction, second waveguide 108 may be a 2D structure having a height in the y-direction, a width in the x-direction, and a thickness in the z-direction, and may include a plurality of structural features disposed in both the x-direction and the y-direction, e.g., corresponding to the vapor cells 112 of a 2D vapor cell array 102 and the detectors 114 of a 2D detector array 104. In some examples, second waveguide 108 may be configured to transport probe light 142 via TIR to distribute coupling light 132 over a 2D area and extract probe light 142 via extraction features on either a front surface or a back surface, e.g., surfaces within the x-y plane, or within second waveguide 108. In some examples, the extraction features may be configured to frustrate TIR and direct probe light 142 in a predetermined direction from a predetermined position of second waveguide 108, e.g., towards detector 114 through vapor cell 112. In some examples, probe light source 140 may introduce probe light 142 into one or more edges of second waveguide 108, as illustrated in FIG. 1. In other examples, second waveguide 108 may be an optical element having optical power such as a lens or lenslet array, a diffraction grating, or any optical element configured to direct probe light 142 to detectors 114 of detector array 104 through vapor cells 112 of vapor cell array 102. In some examples, second waveguide 108 may not be waveguide transporting probe light 142 via TIR but may instead be another structure configured to direct probe light 142 in a predetermined direction from a predetermined position of second waveguide 108, e.g., an array of beam splitters. In some examples, system 100 may include a plurality of probe light sources 140, for example, distributed along one or more edges of second waveguide 108 and configured to introduce probe light into one or more edges of second waveguide 108. In some examples, probe light source 140 may introduce coupling light into second waveguide 108 via any surface and at any position of second waveguide 108, e.g., via emitting light to a coupling structure located on any surface of second waveguide 108 and configured to direct coupling light into second waveguide 108 for transport.

In some examples, imaging system 100 may include one of first or second waveguides 106 or 108 configured to transport and extract both coupling light 132 and probe light 142. In other examples, imaging system 100 may not include waveguides 106 and 108 and may direct coupling light 132 to vapor cell array 102 and probe light 142 to detectors 114 of detector array 104 through vapor cells 112 of vapor cell array 102 via any other means, e.g., an array of light sources 130 and 140, via optical fibers, and the like.

Detector array 104 may include a plurality of detectors 114. As noted above, although the cross-sectional view of FIG. 1 illustrates detector array 104 as a 1D array including a plurality of detectors 114 in the y-direction, detector array 104 may be a 2D array including a plurality of detectors 114 in both the x-direction and the y-direction. Detectors 114 of detector array 104 may be configured to detect electromagnetic radiation, for example, infrared and/or visible light. Detectors 114 may be large-bandgap solid-state visible wavelength detectors configured to operate at without cooling, e.g., at room temperature. For example, detector array 104 may be a charge-coupled device (CCD) array, metal-oxide-semiconductor based array such as a complementary metal-oxide-semiconductor (CMOS) array or N-type metal-oxide-semiconductor (NMOS) array. Detectors 114 of detector array 104 may be configured to detect probe light from probe light source 140. In some examples, detector array 104 may be configured to output one or more signals proportional to the detected electromagnetic radiation, e.g., the detected probe light. For example, detector array 104 may be configured to output a 2D image of detected probe light, the detected probe light corresponding to EM radiation to be detected 152 that is transduced and/or converted to probe light 142 via vapor cells 112. In some examples, detector array 104 may be configured to output a pixelated 2D image corresponding to EM radiation to be detected 152 in two dimensions, e.g., an image comprising a plurality of pixels.

Imaging optics 110 may include a lens, a 1D or 2D lens array, diffraction gratings, stackable THz-focusing optics, and the like. In some examples, imaging optics are configured to direct and/or focus EM radiation to be detected 152 on vapor cells 112. In some examples, system 100 may not include imaging optics 110 and may operate as a phased array.

In some examples, system 100 may include PICs for in-plane beam routing and detection, e.g., for coupling light 132 and probe light 142. For example, one or more of light source 130, light source 140, detector array 104, first waveguide 106, and second waveguide 108 may be integrated/combined as a PIC.

Computing device 120 may be configured to receive signals from detector array 104 indicative of detected probe light proportional to EM radiation to be detected 152. Computing device 120 includes computation engine 122, memory 124, communication unit 118, processing circuitry 116, one or more hardware user interfaces 128 (hereinafter "hardware user interface 128"), and one or more output devices 126. In the example of FIG. 1, a user of computing device 120 may provide input to computing device 120 via one or more input devices (not shown) such as a keyboard, a mouse, a microphone, a touch screen, a touch pad, or another input device that is coupled to computing device 120 via one or more hardware user interfaces 128.

Output devices 126 may include a display, sound card, video graphics adapter card, speaker, presence-sensitive screen, one or more USB interfaces, video and/or audio output interfaces, or any other type of device capable of generating tactile, audio, video, or other output. Output devices 126 may include a display device, which may function as an output device using technologies including liquid crystal displays (LCD), quantum dot display, dot matrix displays, light emitting diode (LED) displays, organic light-emitting diode (OLED) displays, cathode ray tube (CRT) displays, e-ink, or monochrome, color, or any other type of display capable of generating tactile, audio, and/or visual output.

Computing device 120, in some examples, includes communication unit 118. Communication unit 118 is configured to receive electrical signal input from one or more sensors, such as detectors 114. Communication unit 118 may transmit to and/or receive electrical signal input/output from coupling light source 130, probe light source 140, vapor cells 112, and imaging optics 110, via a wired or a wireless connection. For example, computing device 120 may communicate via communication unit 118 to configure coupling light source 130, probe light source 140, vapor cells 112, and imaging optics 110. Communication unit 118 may be configured to convert the received electrical signals into a form usable by computing device 120. For example, communication unit 118 may include software or hardware configured to convert a received signal input from an analog signal to a digital signal. In another example, communication unit 118 may include software or hardware configured to compress, decompress, transcode, encrypt, or decrypt a received signal input into a form usable by computing device 120. In another example, communication unit 118 may include a network interface device to receive packetized data representative of image data and/or input/output data. In such examples, an intermediate device may packetize signals to produce the packetized data and send the packetized data to computing device 120. In this manner, communication unit 118 may be configured to interface with, or communicate with any of detectors 114, coupling light source 130, probe light source 140, vapor cells 112, and imaging optics 110.

Computation engine 122 may be implemented in circuitry. For instance, computation engine 122 may include processing circuitry 116, which may be any one or more of a microprocessor, a controller, a digital signal processor (DSP), an application specific integrated circuit (ASIC), a field-programmable gate array (FPGA), or equivalent discrete or integrated logic circuitry. The functions attributed to processors described herein, including computation engine 122 and processing circuitry 116, may be provided by processing circuitry of a hardware device, e.g., as supported by software and/or firmware. Computation engine 122 may be configured to generate a digital image based on signals received from detector array 104. Computation engine 122 may also be configured to control the output of light sources 130 and 140 and receive information indicative of the output of light sources 130 and 140, e.g., feedback regarding brightness and spectral content of light sources 130 and 140. In some examples, computing engine 122 may be configured to control imaging optics 110, e.g., to change focus and zoom.

Processing circuitry 116 may be communicatively coupled to imaging system 100, for example via communication unit 118. For example, processing circuitry 116 may process signals received via communication unit 118 from detector array 104 and indicative of detected probe light proportional to EM radiation to be detected 152. In some examples, processing circuitry 116 may control the output of light sources 130 and 140 and receive information indicative of the output of light sources 130 and 140, e.g., feedback regarding brightness and spectral content of light sources 130 and 140. In some examples, processing circuitry may communicate with imaging optics 110, e.g., to change focus and zoom.

In some examples, computation engine 122 may include memory 124. Memory 124 may include any volatile or non-volatile media, such as a random-access memory (RAM), read only memory (ROM), non-volatile RAM (NVRAM), electrically erasable programmable ROM (EEPROM), flash memory, and the like. Memory 124 may be a storage device or other non-transitory medium. Memory 124 may be used by processing circuitry 116 to, for example, store information related to imaging system 100, such as images and image information, detector array 104 settings, light source 130 and 140 settings, and imaging optics 110 settings. In some examples, processing circuitry 116 may store image information or previously received data from electrical signals in memory 124 for later retrieval. In some examples, processing circuitry 116 may store determined values or any other calculated values, in memory 124 for later retrieval.

In some examples, computing device 120 may be integrated with imaging system 100. In other examples, computing device 120 may be an external device, e.g., a computing device separate from imaging system 100 and configured to communicate with imaging system 100.

FIG. 2A is a perspective view of an example vapor cell array 166, in accordance with the techniques of the disclosure. FIG. 2A illustrates a separated view of vapor cell array 162 as a layer of imaging system 160. In the example shown, vapor cell array 162 includes a plurality of vapor cells 172 arranged in a 2D array. In some examples, vapor cells 172 may be quantum antennas, and vapor cell array 162 may be a quantum antenna array, a phased array, an imaging array, and/or a multi-spectral imaging array.

FIG. 2B is a perspective view of a partially transparent block diagram illustrating an example imaging system 160, in accordance with the techniques of the disclosure. In the example shown, imaging system 160 includes coupling waveguide 166, vapor cell array 162, and a probe waveguide 168 arranged as a layered stack with coupling waveguide 162 adjacent to a detector array 164 and vapor cell array 162 between coupling waveguide 166 and probe waveguide 168. In some examples, vapor cell array 162, coupling waveguide 166, and probe waveguide 168 may form a PIC stack. In the example shown, detector array 164 is illustrated as separated from the other layers but may be a part of the PIC stack in other examples. Each of vapor cell array 162, detector array 164, coupling waveguide 166, and probe waveguide 168 may be substantially similar to vapor cell array 102, detector array 104, first waveguide 106, and second waveguide 108 as described above with respect to FIG. 1. FIG. 2B illustrates coupling light 182 (shown as dotted lines) propagating within coupling waveguide 166 along the y-direction as a plurality of "rows" corresponding to locations of vapor cells 172 and probe light 192 (shown as solid thicker lines) propagating within probe waveguide 168 along the x-direction as a plurality of "columns" corresponding to locations of vapor cells 172. In some examples, coupling light 182 and probe light 192 propagating in orthogonal directions within coupling waveguide 166 and probe waveguide 168, respectively, may allow room for coupling and probe light sources to be arranged along orthogonal edges of the PIC. In some examples, coupling light 182 and probe light 192 may propagate in any direction within coupling waveguide 166 and probe waveguide 168, respectively, and do not need to propagate in orthogonal directions.

Coupling light 182 and probe light 192 may be substantially similar to coupling light 132 and probe light 142, respectively. In some examples, probe waveguide 168 is configured to extract at least a portion of probe light 192 to propagate through vapor cells 172 to detector array 164. In some examples, probe waveguide 168 may be a PIC including a waveguide and one or more extraction features. Coupling waveguide 166 may be configured to extract at least a portion of probe light 182 to propagate through vapor cells 172. In some examples, coupling waveguide 166 may be a PIC including a waveguide and one or more extraction features.

FIGS. 3-7 illustrate example sensors for detecting electromagnetic radiation in the MHz/GHz/THz frequency range and example operating principles and will be described together below.

Figure 3:
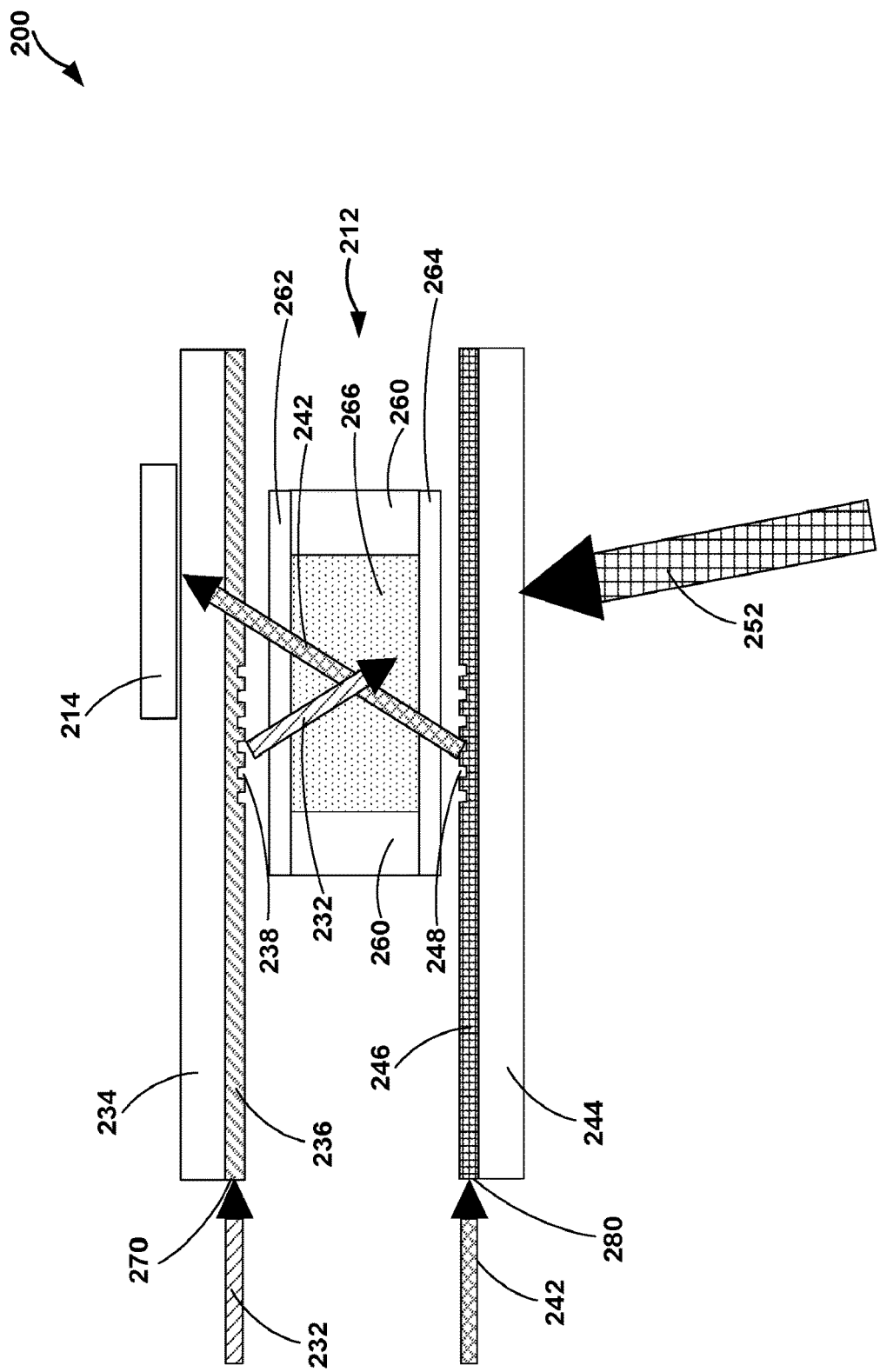
FIG. 3 is a cross-sectional illustration of example sensor, in accordance with the techniques of the disclosure.

FIG. 3 is a cross-sectional illustration of an example sensor 200, in accordance with the techniques of the disclosure. Sensor 200 may be an example of a single "pixel" of system 100 and/or imaging system 160 described above. In the example shown, sensor 200 includes a vapor cell 212 disposed between a probe waveguide 246 and a coupling waveguide 248, and photodetector 214.

In the example shown, vapor cell 212 includes vapor cell sidewalls 260, vapor cell detector end wall 262, and vapor cell front end wall 264 defining a volume and configured to hold alkali atoms within the volume. Vapor cell 212 may include a vapor of alkali atoms 266 in a vapor and an integrated vacuum pump (not shown). Vapor cell detector end wall 262 may be any material configured to hold alkali atoms within the volume and may be substantially transparent to coupling light 232 and probe light 242. Vapor cell front end wall 264 may be any material configured to hold alkali atoms within the volume and may be substantially transparent to probe light 242 and EM radiation 252, e.g., MHz/GHz/THz EM radiation. Vapor cell 212 may transduce, or convert, EM radiation 252 having frequencies in the megahertz (MHz), gigahertz (GHz), and terahertz (THz) ranges to optical frequencies in petahertz (PHz) ranges. Stated in terms of wavelengths, vapor cell 212 may convert electromagnetic radiation in the meter- to millimeter-wavelength ranges to electromagnetic radiation in the UV/VIS/NIR wavelength ranges.

Coupling waveguide 236 may be disposed on substrate 234. Substrate 234 may be any material suitable for providing mechanical support for coupling waveguide 236 to support coupling waveguide 236 in a generally planar shape and may be substantially transparent to coupling light 232. In some examples, substrate 234 may have a lower refractive index at coupling light 232 frequencies than coupling waveguide 236, e.g., enabling TIR within coupling waveguide 236. In some examples, sensor 200 may not include substrate 236 and coupling waveguide 236 may be made of suitable material and a suitable thickness to keep a generally planar shape.

Coupling waveguide 236 may include coupling light director 238. In some examples, coupling waveguide 236 may be a PIC including a waveguide and one or more extraction features. Coupling light director 238 may be configured to extract coupling light 232 from coupling waveguide 236 and direct coupling light 232 to vapor of alkali atoms 266 within the volume of vapor cell 212. For example, coupling light director 238 may comprise one or more extraction features such as a surface relief pattern on either of the surfaces of coupling waveguide 236 at which TIR occurs, and the surface relief pattern may be a diffraction grating. In other examples, coupling light director 238 may include a distribution of painted dots on either of the surfaces of coupling waveguide 236 at which TIR occurs, a variation in shape of either of the surfaces of coupling waveguide 236 at which TIR occurs (e.g., a taper, curve, discontinuity), a scattering material and/or structure within the bulk material of coupling waveguide 236 at the location of coupling light director 238, and the like.

Coupling waveguide 236 may be arranged along any of vapor cell sidewalls 260, vapor cell detector end wall 262, or vapor cell front end wall 264, and configured to extract coupling light 232 into vapor cell 212 to vapor of alkali atoms 266. In other words, coupling light 232 may enter vapor cell 212 from any direction. In the example shown, coupling waveguide 236 is disposed along vapor cell detector end wall 262 between photodetector 214 and vapor cell 212 and is generally planar having its smallest dimension, e.g., thickness, perpendicular to photodetector 214 and confining coupling light 232 to propagation within its thickness and in the x-y directions via TIR. In other examples, coupling waveguide 236 may be disposed along vapor cell front end wall 264, e.g., on the other side of vapor cell 212 and the same side of vapor cell 212 as probe waveguide 246. In still other examples, sensor 200 may include a plurality of coupling waveguides 236 disposed between one or more vapor cells 212, e.g., generally planar having its smallest dimension in either the x or y direction (e.g., perpendicular to waveguide 236 illustrated in FIG. 3) and confining coupling light 232 to propagation within its thickness and in the y-z or x-z directions.

Coupling waveguide 236 may be made of any suitable material substantially transparent to coupling light 232, e.g., UV/VIS/NIR light. For example, coupling waveguide 236 may be glass, polymer material, polycarbonate, polymethylmethacrylate (PMMA), and the like.

In the example shown, coupling waveguide 236 may be an "edge lit" waveguide, e.g., coupling light 232 may be introduced into coupling waveguide 236 from any of the edges of coupling waveguide 236, e.g., any surface of coupling waveguide 236 including the smallest dimension of coupling waveguide 236. In the example shown, coupling light 232 may enter coupling waveguide 236 via edge 270 and may propagate along waveguide 236 in the y-direction via TIR and may be extracted and directed towards vapor of alkali atoms 266 by coupling light director 238.

Probe waveguide 246 may be disposed on substrate 244. Substrate 244 may be any material suitable for providing mechanical support for probe waveguide 246 to support probe waveguide 246 in a generally planar shape and may be substantially transparent to probe light 242. In some examples, substrate 244 may have a lower refractive index at probe light 242 frequencies than probe waveguide 246, e.g., enabling TIR within probe waveguide 246. In some examples, sensor 200 may not include substrate 244 and probe waveguide 246 may be made of suitable material and a suitable thickness to keep a generally planar shape. In some examples, substrate 244 may be substantially similar to substrate 234.

Probe waveguide 246 may include probe light director 248. In some examples, probe waveguide 246 may be a PIC including a waveguide and one or more extraction features. Probe light director 248 may be configured to extract probe light 242 from probe waveguide 246 and direct probe light 242 to photodetector 214 through vapor of alkali atoms 266 within the volume of vapor cell 212. For example, probe light director 248 may comprise one or more extraction features such as a surface relief pattern on either of the surfaces of probe waveguide 246 at which TIR occurs, and the surface relief pattern may be a diffraction grating. In other examples, probe light director 248 may include a distribution of painted dots on either of the surfaces of probe waveguide 246 at which TIR occurs, a variation in shape of either of the surfaces of probe waveguide 246 at which TIR occurs (e.g., a taper, curve, discontinuity), a scattering material and/or structure within the bulk material of probe waveguide 246 at the location of probe light director 248, and the like.

Probe waveguide 246 may be arranged so as to extract probe light 242 to photodetector 214 through vapor cell 212. In some examples, vapor cell 212 may be analogous to an optical shutter for probe light 242 that may vary the amount of probe light 242 transmitted through vapor cell 212 due to variations of the EIT of the vapor of alkali atoms 266 within vapor cell 212 corresponding to an amount and/or frequency of incident EM radiation 252. For example, changes to the EIT of vapor of alkali atoms 266 for probe light 242 may be caused by EM radiation 252 incident on vapor of alkali atoms 266, and the amount of probe light 242 detected by photodetector 214 may be directly proportional to the amount and/or frequency content of EM radiation 252. In this way, vapor cell 212 may be a transducer for the amount and/or frequency content of EM radiation 252 by converting a response to the amount and/or frequency content of EM radiation 252 incident on vapor cell 212, namely, the EIT of vapor of alkali atoms 266 for probe light 242, to a detected amount of probe light 242.

In general, probe light 242 may propagate through vapor of alkali atoms 266 to photodetector 214. In the example shown, probe waveguide 246 is disposed along vapor cell detector end wall 262 on the opposite side vapor cell 212 from photodetector 214 and is generally planar having its smallest dimension, e.g., thickness, perpendicular to photodetector 214 and confining coupling light 242 to propagation within its thickness and in the x-y directions via TIR. In some examples, probe waveguide 246 may be disposed in any direction along any of vapor cell sidewalls 260, vapor cell detector end wall 262, or vapor cell front end wall 264, and configured to extract probe light 242 to photodetector 214 through vapor cell 212. For example, probe waveguide 246 may be disposed along vapor cell front end wall 264, e.g., on the other side of vapor cell 212 and the same side of vapor cell 212 as coupling waveguide 236, extract probe light 246 into vapor cell 212 and through vapor of alkali atoms 266, and a reflector (not shown) may reflect probe light 242 back through vapor of alkali atoms 266 and to photodetector 214. In other examples, a reflector may be arranged so as to reflect probe light 242 to photodetector 214 after having propagated through at least a portion of vapor of alkali atoms 266. For example, sensor 200 may include a plurality of probe waveguides 246 disposed between one or more vapor cells 212, e.g., generally planar having its smallest dimension in either the x or y direction (e.g., perpendicular to waveguide 236 illustrated in FIG. 3) and confining probe light 242 to propagation within its thickness and in the y-z or x-z directions. One or more probe light directors 248 may extract and direct probe light 242 to vapor of alkali atoms 266 through one or both of vapor cell sidewalls 260, which may be substantially transparent to probe light 242. A reflector (not shown) may be arrange so as to reflect probe light 242 entering vapor cell 212 via a sidewall 260 towards photodetector 214 after having propagated through at least a portion of the volume containing vapor of alkali atoms 266. In general, coupling waveguide 236 and probe waveguide 246 may be disposed along, about, adjacent to, in contact with or separated from any of vapor cell sidewalls 260, vapor cell detector end wall 262, or vapor cell front end wall while being configured to extract coupling light 232 and probe light 242, respectively, into vapor cell 232. In some examples, probe waveguide may be disposed so as to direct probe light 242 into vapor cell 232 and such that the probe light 242 directed into vapor cell 232 is subsequently directed towards detector 214, e.g., with or without subsequent light directors such as one or more mirrors, lenses, or gratings.

Probe waveguide 246 may be made of any suitable material substantially transparent to probe light 242, e.g., UV/VIS/NIR light. For example, probe waveguide 246 may be glass, polymer material, polycarbonate, polymethylmethacrylate (PMMA), and the like. In some examples, probe waveguide 246 may be substantially similar to coupling waveguide 236 and may include one or more probe light director 248 substantially similar to coupling light director 238.

In the example shown, probe waveguide 246 may be an "edge lit" waveguide, e.g., probe light 242 may be injected into probe waveguide 246 from any of the edges of probe waveguide 246, e.g., any surface of probe waveguide 246 including the smallest dimension of probe waveguide 246. In the example shown, probe light 242 may enter probe waveguide 246 via edge 280 and may propagate along probe waveguide 246 in the y-direction via TIR and may be extracted and directed towards vapor of alkali atoms 266 by probe light director 248.

Photodetector 214 may be configured to detect electromagnetic radiation, for example, infrared and/or visible light. Photodetector 214 may be substantially similar to detectors 114 described above and may be one of an array of photodetectors 214, e.g., a pixel detector in a 2D focal plane array of pixels. Photodetector 214 may be a large-bandgap solid-state visible wavelength detector configured to operate at without cooling, e.g., at room temperature. For example, detector array 214 may be a pixel of a charge-coupled device (CCD) array, metal-oxide-semiconductor based array such as a complementary metal-oxide-semiconductor (CMOS) array or N-type metal-oxide-semiconductor (NMOS) array. Photodetector 214 may be configured to detect probe light 242 and may be configured to output one or more signals proportional to the detected probe light 242.

Figure 4:
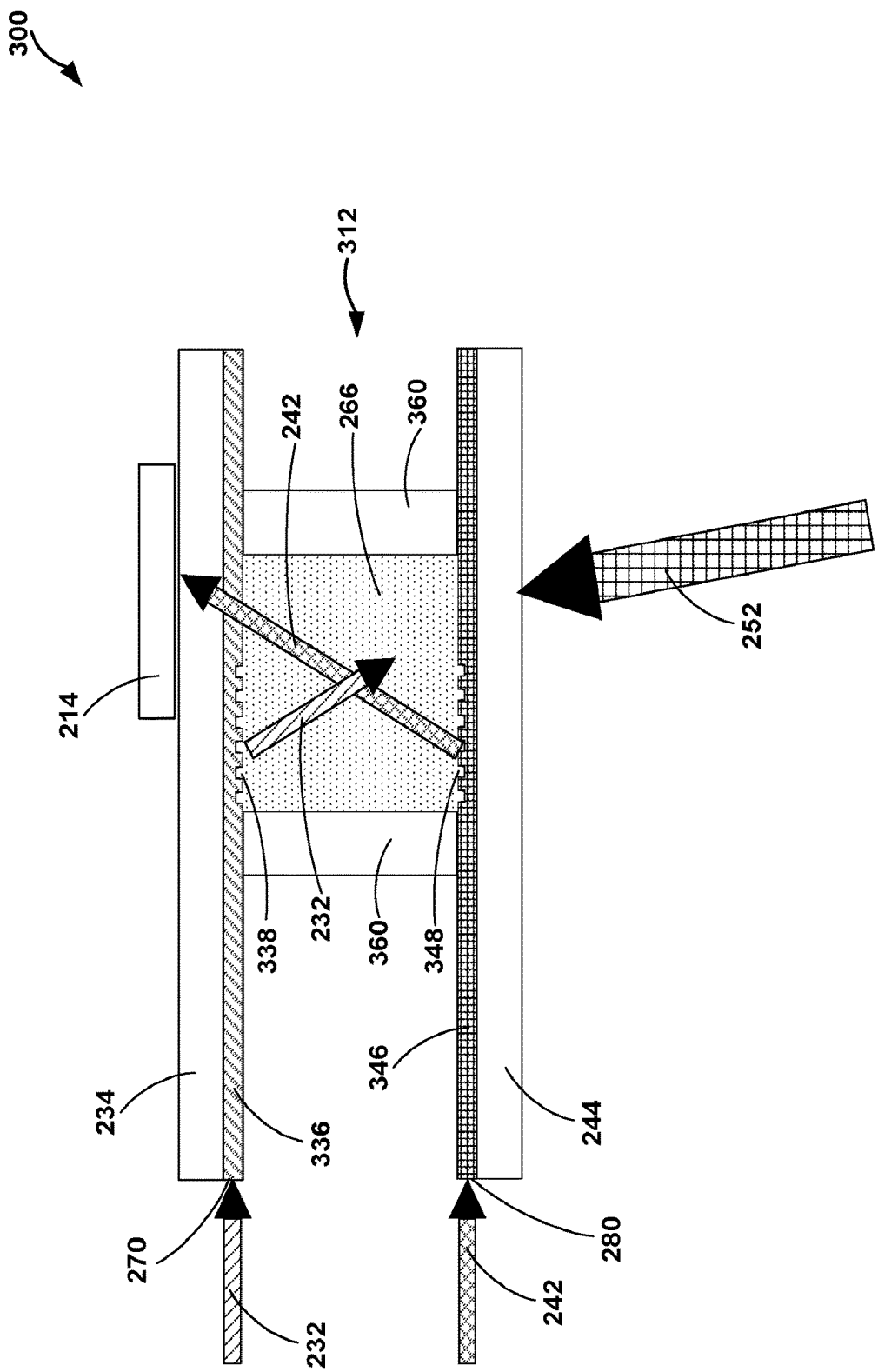
FIG. 4 is a cross-sectional illustration of example sensor, in accordance with the techniques of the disclosure.

FIG. 4 is a cross-sectional illustration of an example sensor 300, in accordance with the techniques of the disclosure. Sensor 300 may be an example of a single "pixel" of system 100 and/or imaging system 160 described above. Sensor 300 may be substantially the same as sensor 200 illustrated and described above with respect to FIG. 3, with the difference being that the coupling waveguide and probe waveguides may form the vapor cell end wall and vapor cell front wall, respectively, e.g., the vapor cell may be integrated with the coupling and probe waveguides. Sensor 300 may also include differences supporting integration of the vapor cell and the coupling and probe waveguides, e.g., coupling and probe waveguide materials suitable to be vapor cell walls. In the example shown, sensor 300 includes a vapor cell 312 disposed between a probe waveguide 346 and a coupling waveguide 348, and photodetector 214.

In the example shown, vapor cell 312 includes vapor cell sidewalls 360, coupling waveguide 336 and probe waveguide 346 defining a volume and configured to hold alkali atoms within the volume. Vapor cell 312 may be substantially the same as vapor cell 212, with the difference that coupling waveguide 336 and probe waveguide 346 may be the vapor cell detector and front end walls, respectively, and vapor cell sidewalls 360 may fully extend between coupling waveguide 336 and probe waveguide 346 to define the volume of vapor cell 312. Vapor cell 312 may include a vapor of alkali atoms 266 within the volume and an integrated vacuum pump (not shown).

Coupling waveguide 336 may be configured to hold vapor of alkali atoms 266. For example, coupling waveguide 336 may be made of a material suitable for holding alkali atoms 266, still be transparent to coupling light 232 and probe light 244, and have an index of refraction relative to vapor of alkali atoms 266 to enable TIR at the interface between coupling waveguide 236 a vapor of alkali atoms 266, e.g., glass or any other suitable material. Coupling waveguide 336 and its arrangement with respect to the other components of sensor 300 may otherwise be substantially similar to coupling waveguide 236 illustrated and described above with respect to FIG. 3.

Coupling waveguide 336 may include one or more coupling light directors 338 configured to extract and direct coupling light 232 into vapor of alkali atoms 266. In some examples, coupling waveguide 336 may be a PIC including a waveguide and one or more extraction features. Coupling light extractor 338 may be substantially similar to coupling light director 238 illustrated and described above, with a difference the coupling light director 338 may be configured for extraction of coupling light 232 into vapor of alkali atoms 266, which may have a different index of refraction than air and/or vacuum.

Probe waveguide 346 may be configured to hold vapor of alkali atoms 266. For example, probe waveguide 346 may be made of a material suitable for holding alkali atoms 266, still be transparent to probe light 244 and EM radiation 252, and have an index of refraction relative to vapor of alkali atoms 266 to enable TIR at the interface between probe waveguide 246 a vapor of alkali atoms 266, e.g., glass or any other suitable material. Probe waveguide 346 and its arrangement with respect to the other components of sensor 300 may otherwise be substantially similar to probe waveguide 246 illustrated and described above with respect to FIG. 3.

Probe waveguide 346 may include one or more probe light directors 348 configured to extract and direct probe light 242 into vapor of alkali atoms 266. In some examples, probe waveguide 346 may be a PIC including a waveguide and one or more extraction features. Probe light extractor 348 may be substantially similar to probe light director 248 illustrated and described above, with a difference the probe light director 348 may be configured for extraction of probe light 242 into vapor of alkali atoms 266, which may have a different index of refraction than air and/or vacuum.

Figure 5:
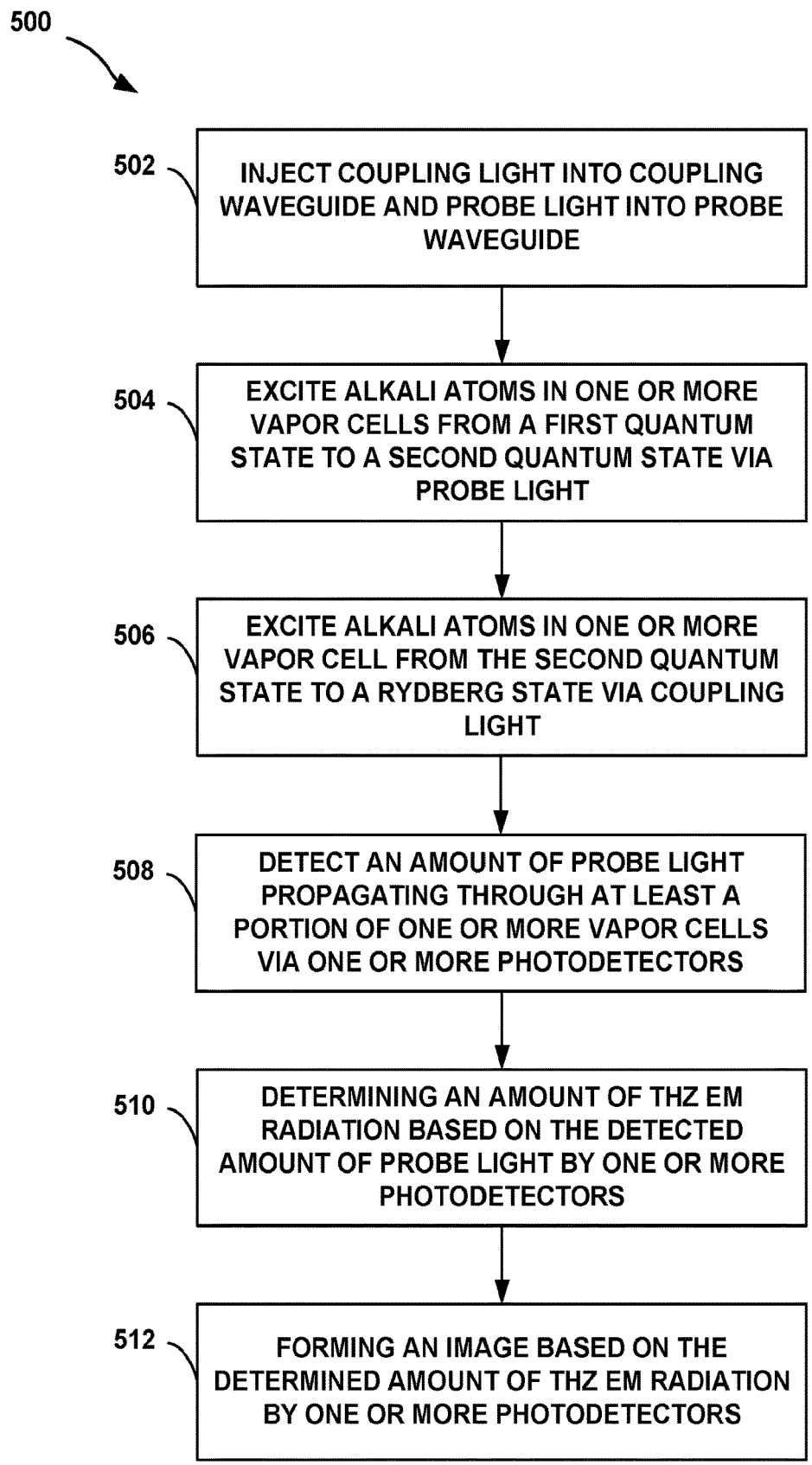
FIG. 5 is a flowchart of an example method of imaging electromagnetic radiation, in accordance with the techniques of the disclosure.

FIG. 5 is a flowchart of an example method 500 of imaging EM radiation, in accordance with the techniques of the disclosure. The method 500 is described with reference to sensors 200 and 300 illustrated and described with reference to FIGS. 3-4, energy level diagrams 600 and 800 illustrated and described below with reference to FIGS. 6 and 8, and plot 700 illustrated and described below with reference to FIG. 7.

Coupling light and probe light may be injected into a coupling waveguide and a probe waveguide, respectively, of a sensor (502). For example, coupling light 232 may be injected into coupling waveguide 236 and/or 336 via edge 270 and probe light 242 maybe injected into probe waveguide 246 and/or 346 via edge 280. Coupling light 232 may propagate within coupling waveguide 236 and/or 336 and may be extracted from coupling waveguide 236 and/or 336 via one or more extraction features, such as coupling light director 238 and/or 348. In some examples, coupling light 232 may be extracted at a plurality of locations via a plurality of coupling light directors 238 and/or 338. Similarly, probe light 242 may propagate within probe waveguide 246 and/or 346 and may be extracted from probe waveguide 246 and/or 346 via one or more extraction features, such as probe light director 238 and/or 348. Probe light 242 may be extracted at a plurality of locations via a plurality of probe light directors 248 and/or 348. For example, sensor 200 and/or 300 may correspond to each "pixel" of 2D array imaging system 100 or 160 with each coupling light director 238 and/or 338 corresponding to a vapor cell 112 and/or 172 and detector 114 of imaging system 100 and/or 160. Coupling light 232 may be extracted from coupling waveguide 236 and/or 336, and probe light 242 may be extracted from probe waveguide 246 and/or 346, for each pixel of the array.

Figure 6:
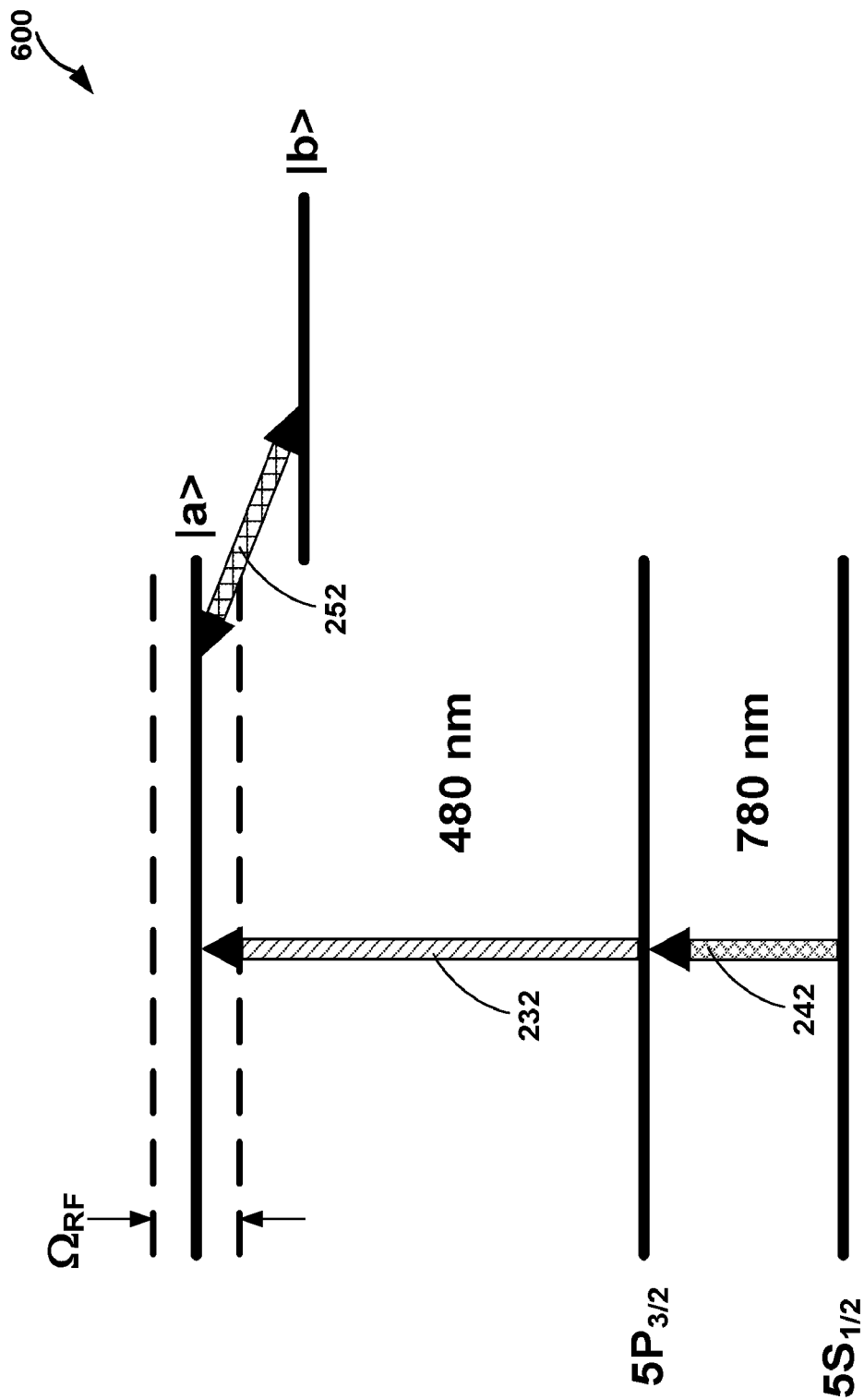
FIG. 6 is an illustration of an illustration of an example energy diagram of an alkali atom including at least one Rydberg state, in accordance with the techniques of the disclosure.

Probe light 242 may excite alkali atoms in one or more vapor cells 112 from a first quantum state to a second quantum state, e.g., a ground state to a first excited state (504). For example, probe light 242 may be extracted from probe waveguide 246 and/or 346 and directed towards one or more photodetectors 214 through one or more vapor cells 112, 212 and/or 312 may excite alkali atoms in one or more vapor cells 112, 212 and/or 312 from a first quantum state to a second quantum state. In some examples, a photon of probe light 242 may be absorbed by an alkali atom, e.g., a rubidium atom, a cesium atom, and the like, in one or more vapor cells 112, 212, and/or 312. The energy absorbed by the alkali atom may drive an electron of the alkali atom into an excited state, e.g., an intermediate quantum state. The quantum state transition for a rubidium atom is illustrated in FIG. 6. FIG. 6 is an illustration of an example energy diagram 600 of an alkali atom including at least one Rydberg state, in accordance with the techniques of the disclosure. In the example shown in FIG. 6, probe light 242 may be 780 nanometer (nm) wavelength laser light, which may drive a transition of a rubidium atom from the $|5S_{1/2}\rangle$ quantum state (e.g., a ground state), to the $|5P_{3/2}\rangle$ quantum state (e.g., an intermediate state).

Coupling light 232 may excite alkali atoms in one or more vapor cells 112 from the second quantum state to a third quantum state, e.g., from the first excited state to a Rydberg state (506). For example, coupling light 232 extracted from coupling waveguide 246 and/or 346 and directed towards one or more vapor cells 112, 212 and/or 312 may excite alkali atoms in one or more vapor cell 112, 212 and/or 312 from the second quantum state to a Rydberg state with a higher principal quantum number n, e.g., a third quantum state. In some examples, a photon of coupling light 232 may be absorbed by an alkali atom in the second quantum state, e.g., a rubidium atom, a cesium atom, and the like, excited by probe light 242. The coupling light 242 energy absorbed by the alkali atom may drive an electron of the alkali atom into another excited state, e.g., a Rydberg quantum state. In the example shown in FIG. 6, coupling light 232 may be 480 nm wavelength laser light, which may drive a transition of a rubidium atom from the $5P_{1/2}$ quantum state to the Rydberg state |a>. As described above, alkali atoms in a Rydberg state may have loosely bound valence electrons that may be perturbed or ionized by collisions or external fields, e.g., MHz/GHz/THz radiation. The alkali atoms in the Rydberg state |a> may exhibit electromagnetically induced transparency (EIT) for frequencies near the frequency of the probe light 242. In the example shown, EM radiation 252 incident on vapor of alkali atoms 266 in Rydberg state |a> may be on-resonant with the energy splitting between Rydberg state |a> and Rydberg state |b>, and may cause EIT in vapor of alkali atoms 266, e.g., Autler-Townes splitting of an absorption line of probe light 242 propagating through vapor of alkali atoms 266.

In some examples, each alkali atom of vapor of alkali atoms 266 of any of one or more vapor cells 112, 212, and/or 312 may respond like an independent transducer, e.g., converting incident on-resonant EM radiation 252 to an optical signal response via probe light 242. The ensemble of alkali atoms of vapor of alkali atoms 266 of any of one or more vapor cells 112, 212, and/or 312 may amplify the signal incoherently.

In some examples, the alkali atoms may be laser cooled, e.g., to reduce motion of the alkali atoms in the vapor. In some examples, laser cooling of the alkali atoms may increase the stability of the atoms in the Rydberg state and/or any of the intermediate quantum states above the ground state.

One or more photodetectors 214 may detect an amount of probe light after the probe light propagates through one or more vapor cell, e.g., probe light 242 after propagating through one or more vapor cell 112, 212 and/or 312 (508). In some examples, the absorption spectrum of the alkali atoms as a function of probe light 242 detuning across the $|5S_{1/2}>\rightarrow|5P_{3/2}>$ resonance may be detected. In the absence of coupling light 232, the probe light 242 absorption spectrum looks like a wide (near-GHz), room-temperature Doppler-broadened dip in the intensity level of the probe light 242 after it passes through one or more vapor cells 112, 212 and/or 312. In the presence of strong on-resonant coupling light 232, the index of refraction of vapor of alkali atoms 266 is modified around the probe light 242 resonance frequency such that a spectrally narrow transparency "window" is "opened." In some examples, the EIT spectral "window" is a few MHz wide and appears as a narrow peak in probe light 242 intensity at the bottom of the Doppler profile. The peak may indicate a resonance condition of both probe light 242 and coupling light 232, and the presence of the peak may indicate that the vapor of alkali atoms 266 may be well-coupled to a Rydberg state. In some examples, perturbations to the energy level of that state, e.g., $\Omega_{RF}$ as illustrated in FIG. 6, due to incident EM radiation 252 may be determined. For example, the signal response of probe light 242 detected by photodetector 214 may vary in proportion to perturbations to the energy level of a Rydberg state due to EM radiation 252 incident on vapor cell 212 and/or 312, as described below with reference to FIG. 7. The spectral narrowness of the EIT peak allows for sub-Doppler precision in measurements of the room-temperature vapor-cell atomic response to EM radiation 252.

Figure 7:
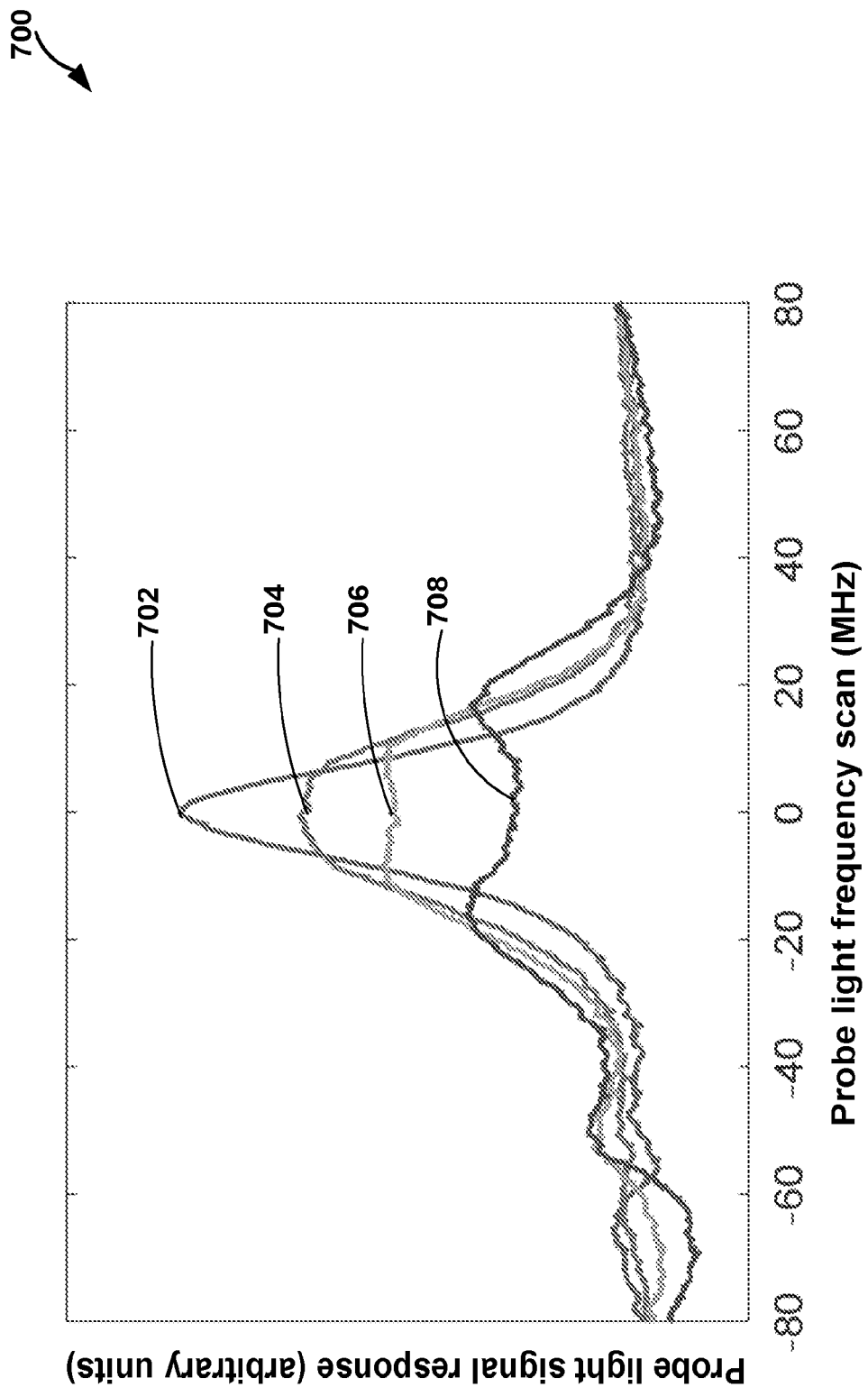
FIG. 7 is an example plot illustrating absorption signal responses of probe light as a function of probe light frequency detuning, in accordance with techniques of the present disclosure.

FIG. 7 is an example plot 700 illustrating absorption signal responses of probe light 242 as a function of probe light frequency detuning, in accordance with techniques of the present disclosure. In the example shown, the absorption signal response examples correspond to the amount of probe light 242 detected by one or more photodetector 214 as a function of detuning, e.g., frequency sweeping and/or scanning, probe light 242. In the example shown, a frequency of 0 Hz on the x-axis of plot 700 corresponds to the $|5S_{1/2}>\rightarrow|5P_{3/2}>$ resonance frequency, e.g., substantially near 780 nm (e.g., 780.2460209 nm or 384.228022 THz). By way of reference, the detuning range of plot 700 from ±80 MHz corresponds to a wavelength range of about ±0.0001625 nm. Plot 700 includes four probe light 242 signal response plots corresponding to four different amounts of 17.04 GHz radio frequency (RF) EM radiation 252 incident on vapor of alkali atoms 266. Plot 702 is the absorption signal response of probe light 242 with 0 milliwatts (mW) of 17.04 GHz RF light (e.g., EM radiation 252) incident on vapor cell 212 and/or 312 and is a Doppler-broadened dip in the intensity level of the probe light 242 after it passes through vapor cell 212 and/or 312. Plot 708 is the absorption signal response of probe light 242 with 1.0 mW of 17.04 GHz RF light incident on vapor cell 212 and/or 312 and includes a narrow peak in probe light 242 intensity at the bottom of the Doppler profile, e.g., an EIT window. Plots 704 and 706 are the absorption signal responses of probe light 242 with 0.2 mW and 0.5 mW of 17.04 GHz RF light, respectively, and illustrate relative changes in the magnitude and shape of the absorption signal response with differing amounts of 17.04 GHz RF light incident on vapor cell 212 and/or 312.

Processing circuitry, e.g., processing circuitry 116, may determine an amount and/or one or more frequencies of EM radiation, e.g., EM radiation 252, based on the detected amount of probe light, e.g., probe light 252 by one or more photodetectors 214 (510). For example, processing circuitry may determine an amount and/or one or more frequencies of EM radiation 252 incident on vapor cell 212 and/or 312 based on an absorption signal response of probe light 242. In some examples, processing circuitry 116 may determine an amount and/or one or more frequencies of EM radiation 252 incident on vapor cell 212 and/or 312 based on any of the amplitude, shape, and spectral content of the absorption signal response of probe light 242 after propagation of probe light 242 through vapor cell 212 and/or 312 as a function of detuning, wavelength scanning and/or sweeping, and/or frequency scanning and/or sweeping. In other words, e.g., an absorption signal response plots similar to absorption signal response plots 702-708 described above.

Processing circuitry, e.g., processing circuitry 116, may form an image based on the determined amount of EM radiation, e.g., EM radiation 252, received at a plurality of detectors (512). For example, processing circuitry may determine a grayscale and/or color representation of each "pixel" of imaging system 100 and/or 160 and/or a plurality of sensors 200 and/or 300.

In some examples, imaging system 100 and/or 160, and sensor 200 and/or 300 may be configured to excite alkali atoms in a vapor cell, e.g., vapor cell 112, 212, and/or 312, using a plurality of frequencies of coupling lights 232 and/or probe light 242. For example, the example shown in FIG. 6 illustrates a "three-level" system in which alkali atoms may be excited from a first energy level to a second, e.g., intermediate energy level via probe light 242, and from the second energy level to a third energy level in which the alkali atoms are in a Rydberg state. In some examples, any of imaging system 100 and/or 160 and sensor 200 and/or 300 may be configured to excite alkali atoms in a vapor cell using a system including more or fewer levels. For example, any of imaging system 100 and/or 160 and sensor 200 and/or 300 may be configured to excite alkali atoms in a vapor cell using a two-level system, or any other number system. In some examples, a probe light sufficient to excite atoms from a first state, e.g., a ground state, directly to a Rydberg state may require probe light 242 having frequencies corresponding to far-UV light, which may make a two-level system difficult and/or costly to implement using current light sources and detectors. By way of contrast, a system having three or more levels may have a reduced difficulty and implementation cost due to greater availability of higher performing and lower cost light sources and detectors.

Figure 8:
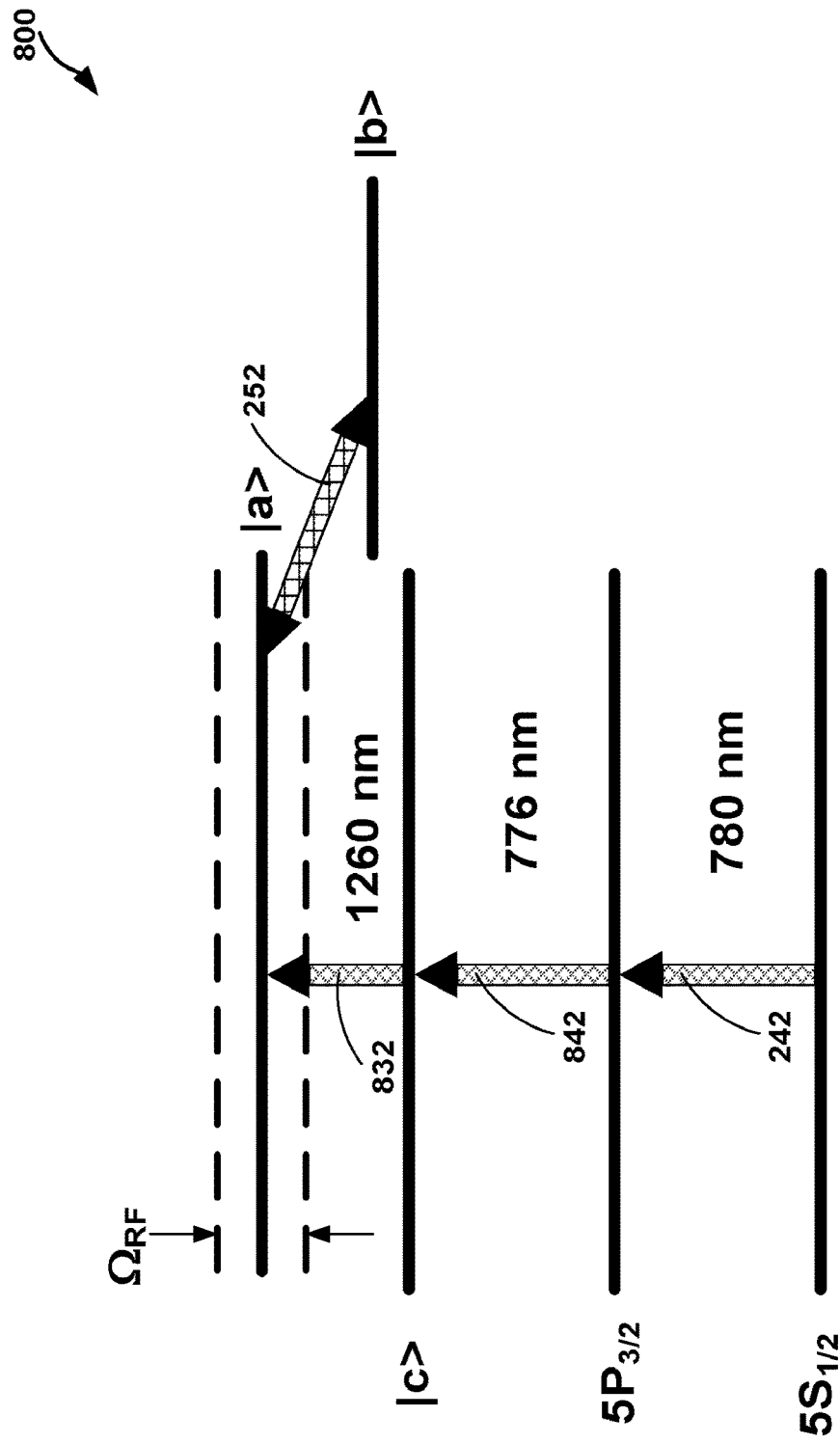
FIG. 8 is an illustration of an illustration of an example energy diagram of an alkali atom including at least one Rydberg state, in accordance with the techniques of the disclosure.

FIG. 8 is an illustration of an illustration of an example energy diagram 800 of an alkali atom including at least one Rydberg state, in accordance with the techniques of the disclosure. In the example shown in FIG. 8, probe light 242 may be 780 nanometer (nm) wavelength laser light, which may drive a transition of a rubidium atom from the $|5S_{1/2}\rangle$ quantum state (e.g., a ground state), to the $|5P_{3/2}\rangle$ quantum state (e.g., an intermediate state). Light 842 may be 776 nanometer (nm) wavelength laser light, which may drive a transition of a rubidium atom from the intermediate $|5P_{3/2}\rangle$ quantum state to another intermediate $|\kappa\rangle$ quantum state. Coupling light 832 may be 1260 nm wavelength laser light, which may drive a transition of a rubidium atom from the $|c\rangle$ quantum state to the Rydberg state $|a\rangle$. In some examples, 1260 nm light sources may be more common, less costly, and more powerful compared with blue 480 nm laser light sources.

Coupling light 832 and light 842 may be delivered to vapor cell 112, 212, and/or 212 via either of coupling waveguide 236 and/or 336 and/or probe waveguide 246 and/or 346. For example, coupling waveguide 236 and/or 336 and probe waveguide 236 and/or 336 may be configured to receive and distribute a plurality of frequencies of light, e.g., any of coupling light 232 and 832, light 842, and probe light 242, concurrently, and may be configured with a plurality of light directors configured to extract and direct one or more of the plurality of frequencies of light to a vapor cell, e.g., vapor cell 112, 212, and/or 312.

In some examples, any of sensors 200, 300, 1100, and/or 1200 may be configured to excite alkali atoms, e.g., in any of vapor cells 112, 212, 312, 1112, or 1212, via multiple quantum states and/or energy levels. For example, either of waveguide 236 and 246 (e.g., PICs 236 and 246) may be configured to direct light of two or more wavelengths into any of vapor cells 112, 212, 312, 1112, or 1212 and incident on the vapor of alkali atoms, and the light of each wavelength of the two or more wavelengths may each be configured to excite the alkali atoms from a lower excited state to a higher excited state sequentially from the first excited state to the Rydberg state. In some examples, exciting alkali atoms from a lower state to a Rydberg state via one or more intermediate states via the use of lower frequency (higher wavelength) excitation light as described above, e.g., a "three-or-more photon" excitation scheme, may reduce the photoelectric effect of the incident light on the alkali atoms relative to a "two-photon" excitation scheme such as described with reference to FIG. 6. For example, exciting alkali atoms via multiple quantum states and/or energy levels may reduce background charges in the vapor relative to a two-photon scheme due to a reduced photoelectric effect relative to the two-photon scheme due to use of lower energy excitation light, e.g., lower frequency light, to excite the alkali atoms to the higher states. In other words, the net effect of several lower energy transitions to excite the alkali atoms to a Rydberg state versus two higher energy transitions is a reduction in background charges that may accumulate in the vapor cell due to the photoelectric effect. In some examples, the reduction of the background charges may reduce noise in measuring the ionization of the excited alkali atoms in the Rydberg state due to incident EM radiation 252, such as illustrated and described below with reference to FIGS. 10-11, and thereby increase the readout sensitivity of sensors 1100 and 1200 described below. For example, the amount of current flowing in circuits 1120 and or 1220 may correspond to both the ionization of the excited alkali atoms (signal) and any background charges (noise) in the vapor of alkali atoms.

Figure 9:
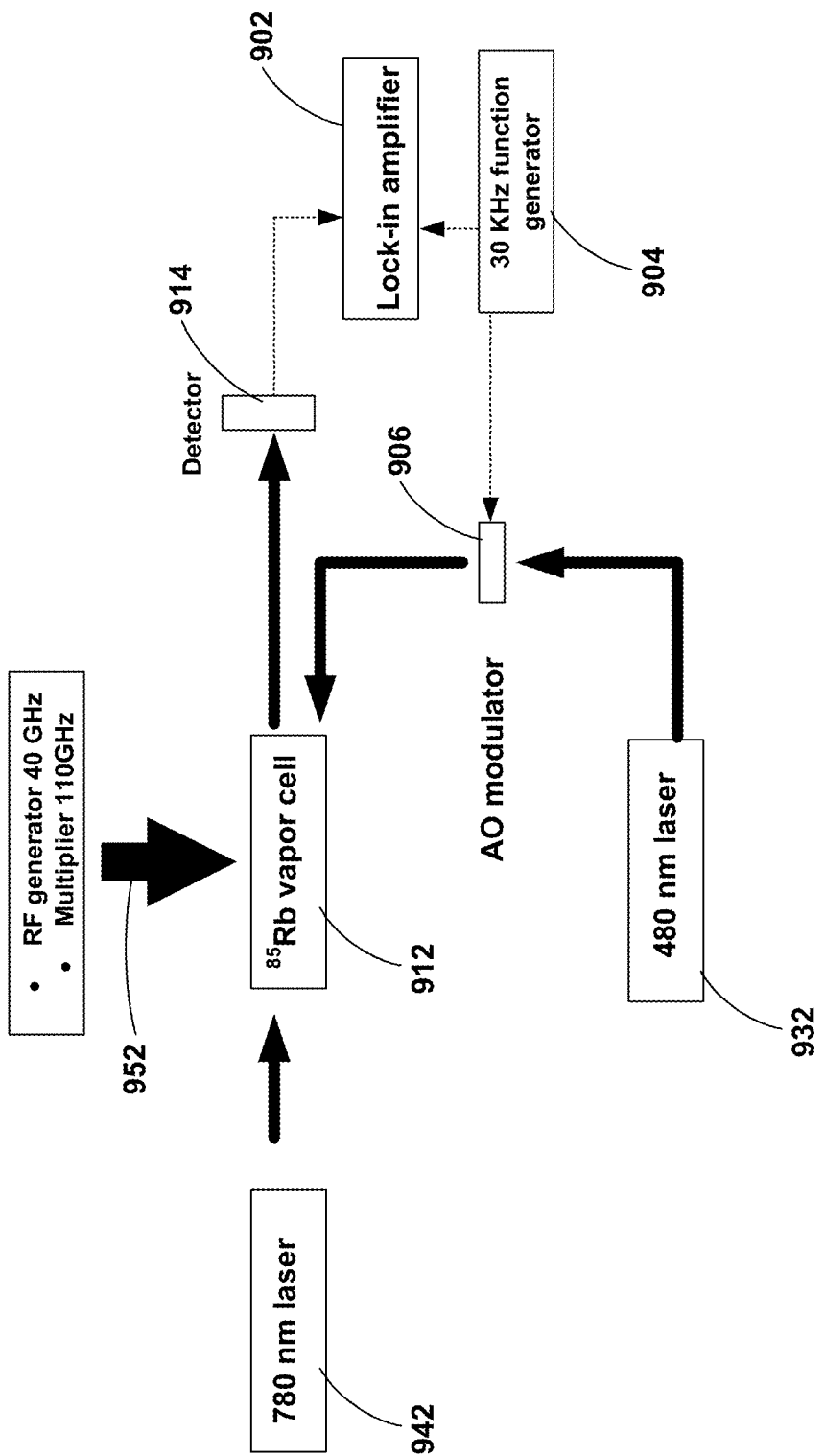
FIG. 9 is a block diagram of an example system 900 for sensing EM radiation, in accordance with techniques of the present disclosure.

FIG. 9 is a block diagram of an example system 900 for sensing EM radiation, in accordance with techniques of the present disclosure. FIG. 9 includes a probe laser 942, coupling laser 932, vapor cell 912, EM radiation 952, detector 914, lock-in amplifier 902, function generator 904, and acousto-optic modulator 906. In some examples, lock-in amplifier 902, function generator 904, and acousto-optic modulator 906 may be configured in a feedback loop to tune coupling laser 932 to a resonant frequency of an alkali atom in vapor cell 912. System 900 may be used to excite a vapor of alkali atoms in vapor cell 912 to a Rydberg state and determine an amount and/or frequency of EM radiation 952 in a MHz/GHz/THz frequency range based on EIT of the alkali atom vapor for probe light from probe laser 942 and/or perturbations of EIT for the probe light from probe laser 942.

Figure 10:
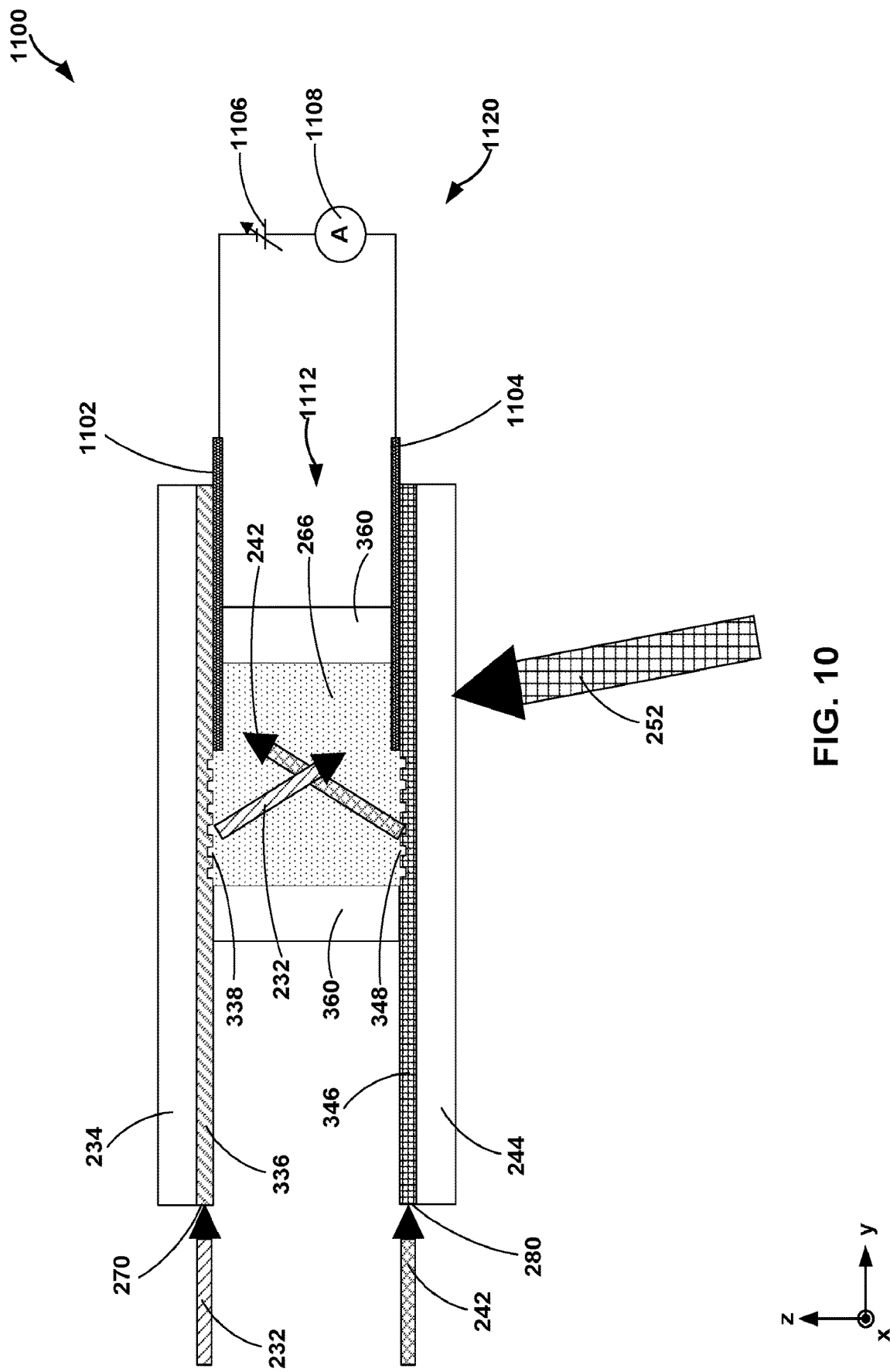
FIG. 10 is a cross-sectional illustration of example sensor, in accordance with the techniques of the disclosure.

FIG. 10 is a cross-sectional illustration of example sensor 1100, in accordance with the techniques of the disclosure. Sensor 1100 may be an example of a single "pixel" of system 100 and/or imaging system 160 described above. Sensor 1100 may be substantially the same as sensor 300 illustrated and described above with respect to FIG. 3, with the difference being that photodetector 214 is removed and electrical circuit 1120 is included. In the example shown, sensor 1100 includes a vapor cell 1112 disposed between a probe waveguide 346 and a coupling waveguide 348, and photodetector 214.

In the example shown, electrical circuit 1120 includes first electrode 1102, second electrode 1104, electrical power source 1106, and ammeter 1108. First and second electrodes 1102 and 1104 extend within vapor cell 1112 and may form a portion of one of the walls of vapor cell 1112. In the example shown, first and second electrodes 1102 and 1104 are disposed on coupling waveguide 336 and probe waveguide 346, respectively. First electrode may be connected to a first terminal, e.g., a negative or ground terminal, of electrical power source 1106. Ammeter 1108 may be connected between a second terminal, e.g., a positive terminal of power source 1106 and second electrode 1104 and may be configured to measure a current flowing in circuit 1120. Power source 1106 may be configured to apply a voltage across first and second electrodes 1102, 1104. In some examples, power source 1106 and first and second electrodes 1102, 1104 may be configured to apply 100 volts with a 5 millimeter separation between first and second electrodes 1102, 1104.

In operation, the amount of current flowing in circuit 1120 corresponds to the ionization of the alkali atoms within vapor cell 1112. In some examples, the alkali atoms in a Rydberg state within vapor cell 1112 may be sensitive to EM radiation 252, that is, the ionization of the alkali atoms changes corresponding to the frequency and/or amount of EM radiation 252 and may change in response to a change in EM radiation 252, which in turn may cause a change in the amount of current flowing in circuit 1120. Ammeter 1108 may then determine the amount of current flowing, and ammeter 1108 and/or circuit 1112 may be configured to output a signal correlated to the change in the current in circuit 1112.

Figure 11:
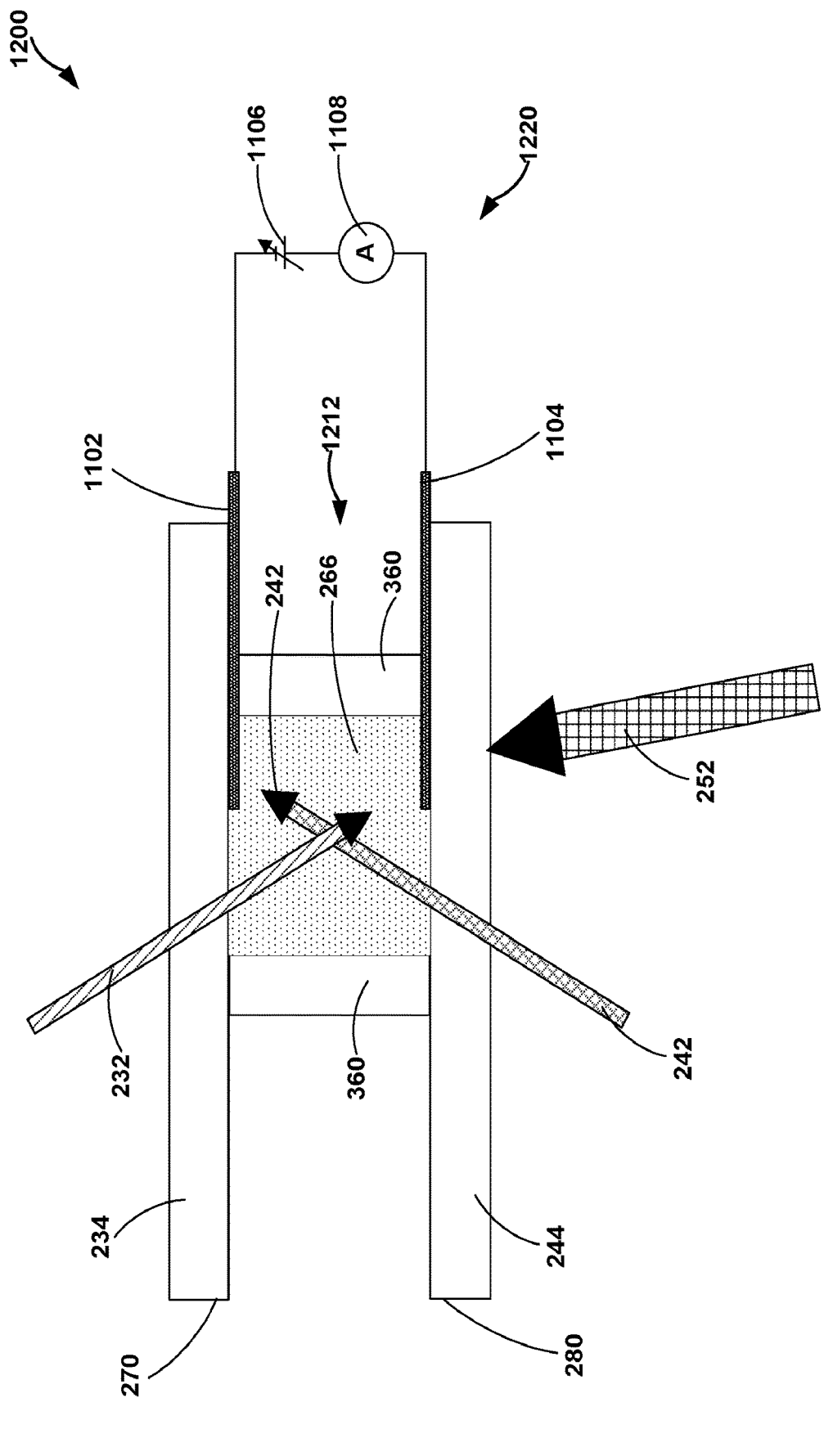
FIG. 11 is a cross-sectional illustration of example sensor, in accordance with the techniques of the disclosure.

FIG. 11 is a cross-sectional illustration of example sensor 1200, in accordance with the techniques of the disclosure. Sensor 1200 may be an example of a single "pixel" of system 100 and/or imaging system 160 described above. Sensor 1200 may be substantially the same as sensor 1100 illustrated and described above with respect to FIG. 10, with the difference being that coupling waveguide 336 and probe waveguide 346 are removed. In the example shown, coupling light 232 and probe light 242 may be directed to be incident on the alkali atoms of vapor cell 1212, e.g., via a light direction means (not shown).

In the example shown, electrical circuit 1220 may be substantially similar to electrical circuit 1120 of FIG. 10, only first electrode 1102 and second electrode 1104 may be disposed at least partially on the inner surfaces of substrates 234 and 244, respectively, rather than waveguides 336 and 346, which are not included with sensor 1200. In the example shown, first and second electrodes 1102 and 1104 extend within vapor cell 1212 and may form a portion of one of the walls of vapor cell 1212. Similar to electrical circuit 1120 of FIG. 10, the amount of current flowing in circuit 1220 corresponds to the ionization of the alkali atoms within vapor cell 1212. In some examples, the alkali atoms in a Rydberg state within vapor cell 1212 may be sensitive to EM radiation 252, that is, the ionization of the alkali atoms changes corresponding to the frequency and/or amount of EM radiation 252 and may change in response to a change in EM radiation 252, which in turn may cause a change in the amount of current flowing in circuit 1220. Ammeter 1108 may then determine the amount of current flowing, and ammeter 1108 and/or circuit 1212 may be configured to output a signal correlated to the change in the current in circuit 1212.

Figure 12:
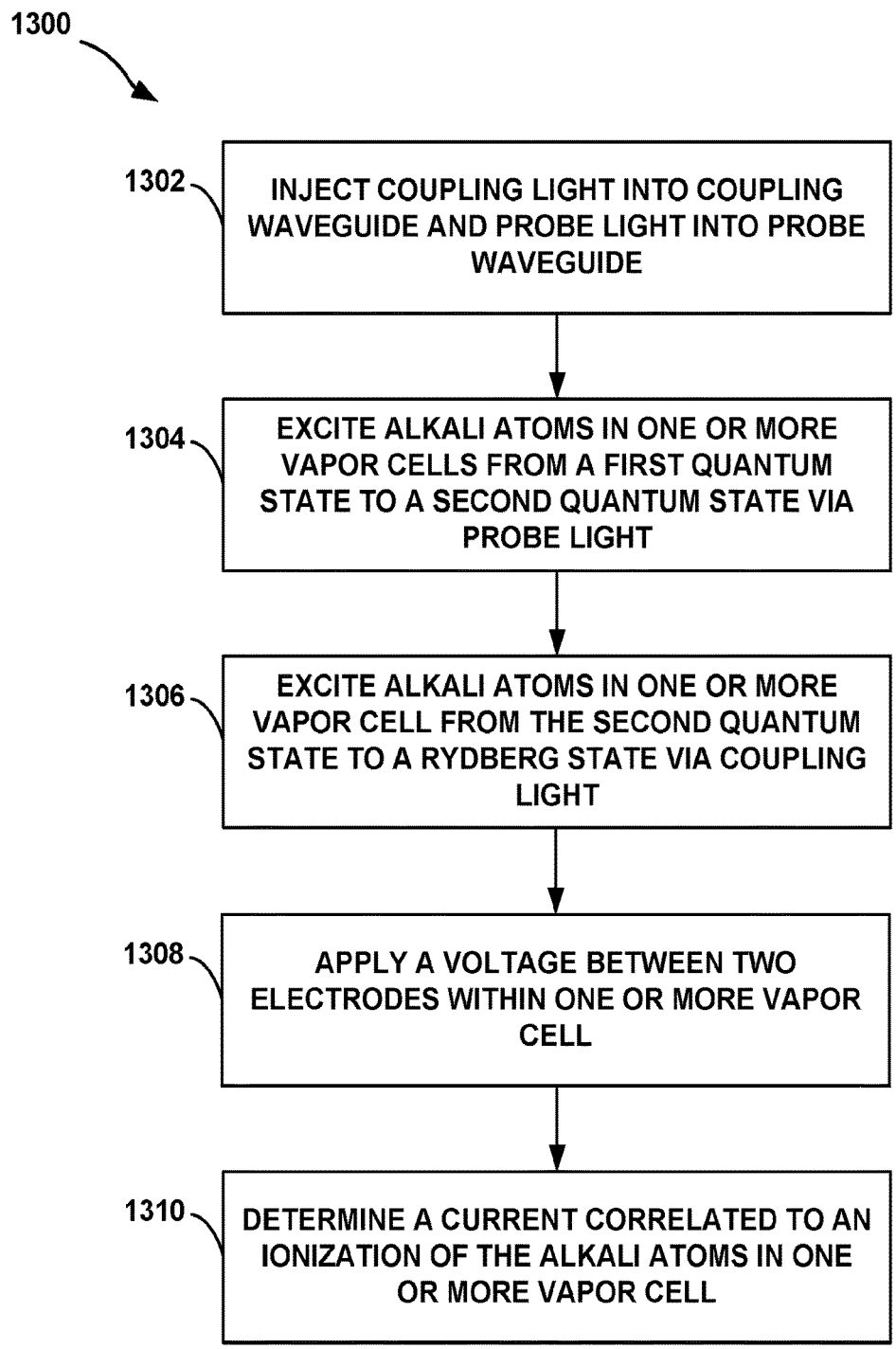
FIG. 12 is a flowchart of an example method of imaging electromagnetic radiation, in accordance with the techniques of the disclosure.

FIG. 12 is a flowchart of an example method 1300 of imaging electromagnetic radiation, in accordance with the techniques of the disclosure. The method 1300 is described with reference to sensors 1100 and 1200 illustrated and described with reference to FIGS. 10-11, energy level diagrams 600 and 800 illustrated and described below with reference to FIGS. 6 and 8, and plot 700 illustrated and described below with reference to FIG. 7.

As described above with reference to FIG. 5 and steps 502, 504, and 506, coupling light and probe light may be injected into a coupling waveguide and a probe waveguide, respectively, of a sensor (1302), e.g., such as sensor 1100, probe light 242 may be directed towards one or more vapor cells 1112 and/or 1212 may excite alkali atoms in one or more vapor cells 1112 and/or 1212 from a first quantum state to a second quantum state (1304), and coupling light 232 may be directed towards one or more vapor cells 1112 and/or 1212 and may excite alkali atoms in one or more vapor cells 1112 and/or 1212 from the second quantum state to a Rydberg state with a high principal quantum number n, e.g., a third quantum state (1306).

An electrical circuit may apply a voltage across two electrodes within one or more vapor cells 1112 and/or 1212 (1308). For example, a first electrode and a second electrode may be spaced apart within a vapor cell 1112 and/or 1212 and may be connected to a power source configured to apply a voltage across the electrodes.

An ammeter may determine and/or detect a current flowing through a circuit including the first and second electrodes and correlated to an ionization of the alkali atoms in one or more vapor cells (1310). For example, EM radiation 252 incident on the alkali atoms within vapor cell 1112 and/or 1212 may ionize the alkali atoms within vapor cell 1112 and/or 1212. The ionization of the alkali atoms within vapor cell 1112 and/or 1212 may correlate to the frequency and/or amount of incident EM radiation 252. Ammeter 1108 may detect the corresponding amount of current, and a change in EM radiation 252 in frequency and/or amount may cause a corresponding change in the amount of current detected by ammeter 1108.

Various examples have been described. These and other examples are within the scope of the following claims. For purposes of this disclosure, the operations shown in the figures do not need to be executed in the manner suggested by the illustrations and, unless specifically stated so, may be executed in any order. Further, the term substantially is to be given its standard definition of to a great or significant extent or for the most part; essentially.

The techniques described in this disclosure may be implemented, at least in part, in hardware, software, firmware, or any combination thereof. For example, various aspects of the techniques may be implemented within one or more microprocessors, DSPs, ASICs, FPGAs, or any other equivalent integrated or discrete logic QRS circuitry, as well as any combinations of such components, embodied in external devices, such as physician or patient programmers, stimulators, or other devices. The terms "processor" and "processing circuitry" may generally refer to any of the foregoing logic circuitry, alone or in combination with other logic circuitry, or any other equivalent circuitry, and alone or in combination with other digital or analog circuitry.

For aspects implemented in software, at least some of the functionality ascribed to the systems and devices described in this disclosure may be embodied as instructions on a computer-readable storage medium such as RAM, DRAM, SRAM, magnetic discs, optical discs, flash memories, or forms of EPROM or EEPROM. The instructions may be executed to support one or more aspects of the functionality described in this disclosure.

In addition, in some respects, the functionality described herein may be provided within dedicated hardware and/or software modules. Depiction of different features as modules or units is intended to highlight different functional aspects and does not necessarily imply that such modules or units must be realized by separate hardware or software components. Rather, functionality associated with one or more modules or units may be performed by separate hardware or software components or integrated within common or separate hardware or software components. Also, the techniques may be fully implemented in one or more circuits or logic elements.

What is claimed is:
1. A sensor, comprising:
a vapor cell including a vapor of alkali atoms;

a first photonic integrated circuit (PIC) configured to direct light of a first wavelength out from the PIC and into the vapor cell and incident on the vapor of alkali atoms, wherein the light of the first wavelength is configured to excite the alkali atoms to a first excited state from a ground state; and a detector configured to detect a response of the alkali atoms, after the alkali atoms are excited from the first excited state to a Rydberg state, to incident electromagnetic radiation.

2. The sensor of claim 1, wherein the first PIC comprises:
a first waveguide configured to guide the light of the first wavelength; and
an extraction feature configured to direct at least a portion of the light of the first wavelength from the first waveguide into the vapor cell and incident on the vapor of alkali atoms.

3. The sensor of claim 2, further comprising:
a second PIC configured to direct light of a second wavelength into the vapor cell and incident on the vapor of alkali atoms, wherein the light of the second wavelength is configured to excite the alkali atoms from the first excited state to the Rydberg state, wherein the second PIC comprises:
a second waveguide configured to guide the light of the second wavelength; and
an extraction feature configured to direct the light of the second wavelength from the second waveguide into the vapor cell and incident on the vapor of alkali atoms.

4. The sensor of claim 3, wherein the first PIC is disposed along a first side of the vapor cell, and wherein the second PIC is disposed along a second side of the vapor cell.

5. The sensor of claim 3, wherein the first PIC is a first side of the vapor cell, and wherein the second PIC is a second side of the vapor cell, wherein the first side is different from the second side.

6. The sensor of claim 3, wherein at least one of the first PIC and the second PIC are configured to direct light of two or more wavelengths into the vapor cell and incident on the vapor of alkali atoms, wherein the light of each wavelength of the two or more wavelengths are each configured to excite the alkali atoms from a lower excited state to a higher excited state sequentially from the first excited state to the Rydberg state.

7. The sensor of claim 1, wherein the detector comprises a photodetector, wherein the response of the alkali atoms in the Rydberg state to incident electromagnetic radiation comprises a change in electromagnetic induced transparency (EIT) of the alkali atoms for the light of the first wavelength.

8. The sensor of claim 7, wherein the photodetector is configured to detect an amount of light of the first wavelength after the light of the first wavelength propagates through the vapor cell, wherein the photodetector is configured to output a signal proportional to the detected amount of light of the first wavelength.

9. The sensor of claim 1, wherein the detector comprises:
an electrical circuit including at least two electrodes spaced apart within the vapor cell and configured to apply a voltage across the at least two electrodes; and
an ammeter configured to measure a current of the electrical circuit including the at least two electrodes,
wherein the response of the alkali atoms in the Rydberg state to incident electromagnetic radiation comprises a change in the ionization of the vapor of alkali atoms.

10. The sensor of claim 9, wherein the ammeter is configured to output a signal correlated to a change in the current of the electrical circuit in response to the change in the ionization of the vapor of alkali atoms.

11. The sensor of claim 1, wherein the alkali atoms are laser cooled.

12. The sensor of claim 1, wherein the alkali atoms are at least one of Rubidium atoms and Cesium atoms.

13. A method comprising:
exciting alkali atoms in a vapor cell, via light of a first wavelength directed out from a first photonic integrated circuit (PIC) and into the vapor cell, to a second quantum state from a first quantum state;
exciting the alkali atoms in the plurality vapor cells, via light of a second wavelength, to a Rydberg state;
detecting a response of the alkali atoms in the Rydberg state to incident electromagnetic radiation; and
outputting a signal proportional to the detected response.

14. The method of claim 13, wherein exciting alkali atoms in a vapor cell via the first PIC comprises:
injecting light of the first wavelength into a waveguide of the first PIC; and
extracting, via a first extraction feature of the first PIC, at least a portion of the injected light of the first wavelength from the first waveguide into the vapor cell.

15. The method of claim 14, wherein exciting alkali atoms in a vapor cell via light of the second wavelength comprises:
injecting light of the second wavelength into a second waveguide of a second PIC; and
extracting, via a second extraction feature of the second PIC, at least a portion of the injected light of the second wavelength from the second waveguide into the vapor cell.

16. The method of claim 13, wherein detecting a response of the alkali atoms in the Rydberg state to incident electromagnetic radiation comprises:
detecting, via a photodetector, an amount of light of the first wavelength after the light of the first wavelength propagates through the vapor cell, wherein the response of the alkali atoms in the Rydberg state to incident electromagnetic radiation comprises a change in electromagnetic induced transparency (EIT) of the alkali atoms for the light of the first wavelength.

17. The method of claim 13, wherein detecting a response of the alkali atoms in the Rydberg state to incident electromagnetic radiation comprises:
detecting, via an ammeter, a change in a current flowing through an electrical circuit including at least two electrodes spaced apart within the vapor cell and applying a voltage across the at least two electrodes,
wherein the response of the alkali atoms in the Rydberg state to incident electromagnetic radiation comprises a change in the ionization of the vapor of alkali atoms.

18. An electromagnetic radiation detection array, comprising:
a plurality of vapor cells arranged in a two-dimensional (2D) array, each vapor cell including a vapor of alkali atoms;
a first photonic integrated circuit (PIC) configured to direct light of a first wavelength out from the first PIC and into each vapor cell of the plurality of vapor cells and incident on the vapor of alkali atoms, wherein the light of the first wavelength is configured to excite the alkali atoms to a first excited state from a ground state;
a second PIC configured to direct light of a second wavelength out from the second PIC and into each vapor cell of the plurality of vapor cells and incident on the vapor of alkali atoms, wherein the light of the second wavelength is configured to excite the alkali atoms from the first excited state to a Rydberg state; and a plurality of detectors, each detector corresponding to one of the plurality of vapor cells and configured to detect a response of the alkali atoms in the Rydberg state to incident electromagnetic radiation.

19. The electromagnetic radiation detection array of claim 18, wherein the plurality of detectors comprises a plurality of photodetectors, each photodetector corresponding to a vapor cell, wherein the response of the alkali atoms in the Rydberg state to incident electromagnetic radiation comprises a change in electromagnetic induced transparency (EIT) of the alkali atoms for the light of the first wavelength, wherein each photodetector of the plurality of photodetectors is configured to detect an amount of light of the first wavelength after the light of the first wavelength propagates through each corresponding vapor cell of the plurality of vapor cells, wherein each photodetector of the plurality of photodetector is configured to output a signal proportional to the detected amount of light of the first wavelength.

20. The electromagnetic radiation detection array of claim 18, wherein each detector of the plurality of detectors comprises:

an electrical circuit including at least two electrodes spaced apart within the corresponding vapor cell of the plurality of vapor cells and configured to apply a voltage across the at least two electrodes; and an ammeter configured to measure a current of the electrical circuit including the at least two electrodes, wherein the response of the alkali atoms in the Rydberg state to incident electromagnetic radiation comprises a change in the ionization of the vapor of alkali atoms of the corresponding vapor cell;

wherein the ammeter is configured to output a signal correlated to a change in the current of the electrical circuit in response to the change in the ionization of the vapor of alkali atoms of the corresponding vapor cell.

* * * * *